United States Patent
Inoue et al.

(10) Patent No.: US 9,379,284 B2
(45) Date of Patent: Jun. 28, 2016

(54) NITRIDE SEMICONDUCTOR LIGHT EMITTING CHIP, AND NITRIDE SEMICONDUCTOR LIGHT EMITTING DEVICE

(71) Applicant: Panasonic Corporation, Osaka (JP)

(72) Inventors: Akira Inoue, Osaka (JP); Toshiyuki Fujita, Osaka (JP); Masaki Fujikane, Osaka (JP); Toshiya Yokogawa, Nara (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 72 days.

(21) Appl. No.: 14/055,002

(22) Filed: Oct. 16, 2013

(65) Prior Publication Data

US 2014/0042456 A1 Feb. 13, 2014

Related U.S. Application Data

(63) Continuation of application No. PCT/JP2012/006754, filed on Oct. 22, 2012.

(30) Foreign Application Priority Data

Feb. 23, 2012 (JP) ................... 2012-037661

(51) Int. Cl.
*H01L 29/15* (2006.01)
*H01L 33/32* (2010.01)
(Continued)

(52) U.S. Cl.
CPC ............... *H01L 33/32* (2013.01); *H01L 24/05* (2013.01); *H01L 33/382* (2013.01); *H01L 33/22* (2013.01);
(Continued)

(58) Field of Classification Search
CPC ........ H01L 33/32; H01L 33/382; H01L 33/22
USPC .......................................... 257/76
See application file for complete search history.

(56) References Cited

U.S. PATENT DOCUMENTS

2005/0062060 A1 3/2005 Nagai et al.
2009/0200563 A1 8/2009 Goshonoo et al.
(Continued)

FOREIGN PATENT DOCUMENTS

JP 49-39370 U 4/1974
JP 04-100277 A 4/1992
(Continued)

OTHER PUBLICATIONS

International Search Report for corresponding International Application No. PCT/JP2012/006754 mailed Jan. 29, 2013.

*Primary Examiner* — Bradley K Smith
(74) *Attorney, Agent, or Firm* — Renner, Otto, Boisselle & Sklar, LLP

(57) ABSTRACT

A nitride semiconductor light emitting chip includes: a conductive substrate including a nitride semiconductor layer; an n-type nitride semiconductor layer, an active layer, and a p-type nitride semiconductor layer sequentially formed on a principal surface of the nitride semiconductor layer; and an n-side electrode formed in contact with the conductive substrate. A recess is formed in a back surface of the conductive substrate opposite to the principal surface. The n-side electrode is in contact with at least part of a surface of the recess. A depth D1 is not less than 25% of a thickness T, where T represents a thickness of the conductive substrate, and D1 represents a depth of the recess.

20 Claims, 25 Drawing Sheets

(51) Int. Cl.
   *H01L 23/00* (2006.01)
   *H01L 33/38* (2010.01)
   *H01L 33/22* (2010.01)

(52) U.S. Cl.
   CPC ....... *H01L 33/38* (2013.01); *H01L 2224/04042* (2013.01); *H01L 2224/05552* (2013.01); *H01L 2224/48091* (2013.01); *H01L 2224/73265* (2013.01); *H01L 2924/12041* (2013.01); *H01L 2924/12042* (2013.01); *H01L 2933/0016* (2013.01)

(56) References Cited

U.S. PATENT DOCUMENTS

| | | | | |
|---|---|---|---|---|
| 2010/0265981 | A1* | 10/2010 | Hiroyama | H01L 33/007 372/49.01 |
| 2010/0295088 | A1* | 11/2010 | D'Evelyn | H01L 33/0079 257/99 |
| 2011/0244610 | A1 | 10/2011 | Saito et al. | |
| 2012/0113656 | A1 | 5/2012 | Iwanaga et al. | |
| 2013/0126901 | A1 | 5/2013 | Isozaki et al. | |
| 2013/0146928 | A1* | 6/2013 | Inoue | H01L 33/20 257/98 |
| 2015/0144871 | A1* | 5/2015 | Miller | H01L 33/06 257/13 |

FOREIGN PATENT DOCUMENTS

| | | |
|---|---|---|
| JP | 2002-016312 A | 1/2002 |
| JP | 2002-299769 A | 10/2002 |
| JP | 2008-098249 A | 4/2008 |
| JP | 2008-305971 A | 12/2008 |
| JP | 2009-218569 A | 9/2009 |
| JP | 2010-157551 A | 7/2010 |
| JP | 2010-177455 A | 8/2010 |
| JP | 2011-211075 A | 10/2011 |
| WO | WO 2011/007816 A1 | 1/2011 |
| WO | WO 2012/017686 A1 | 2/2012 |

\* cited by examiner

FIG.2A
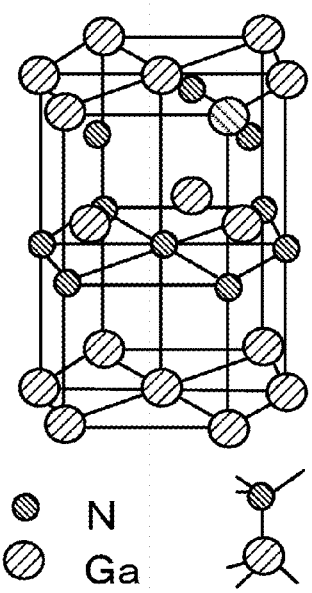
FIG.2B
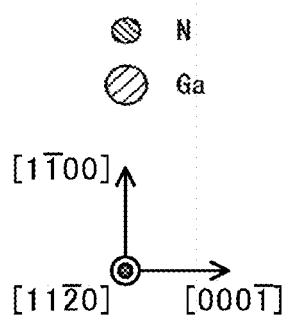
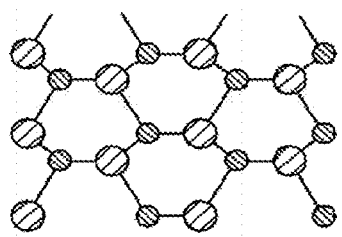
m-Plane
FIG.2C
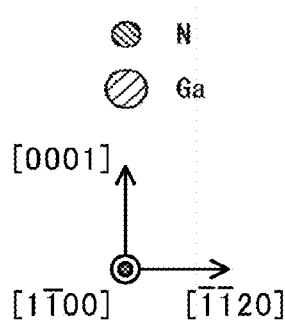
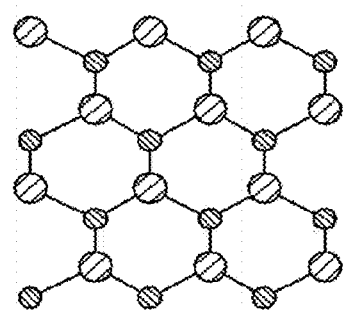
c-Plane

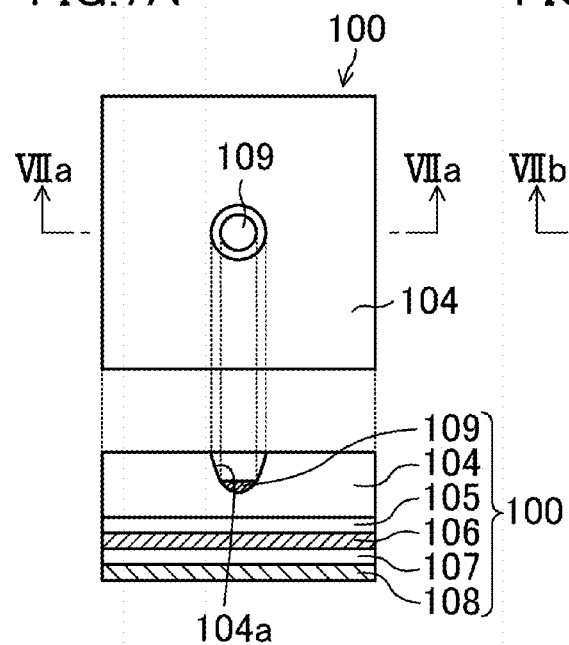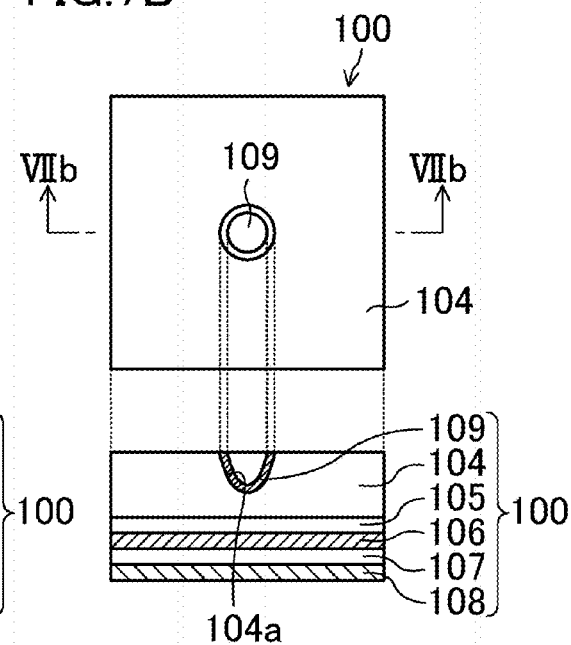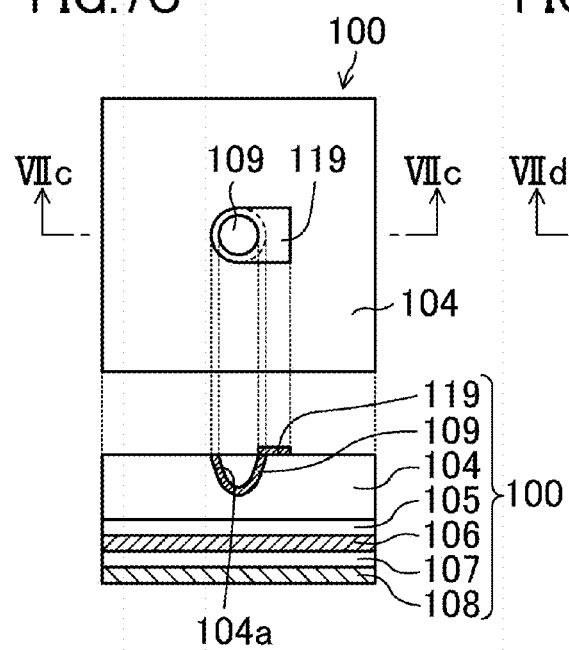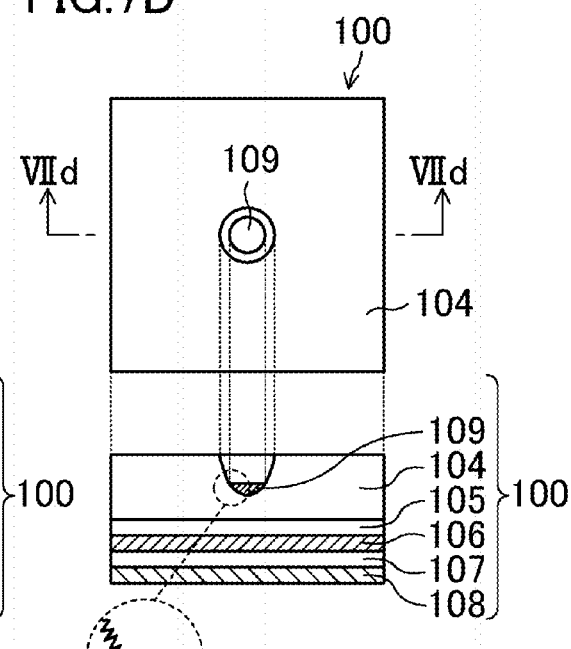

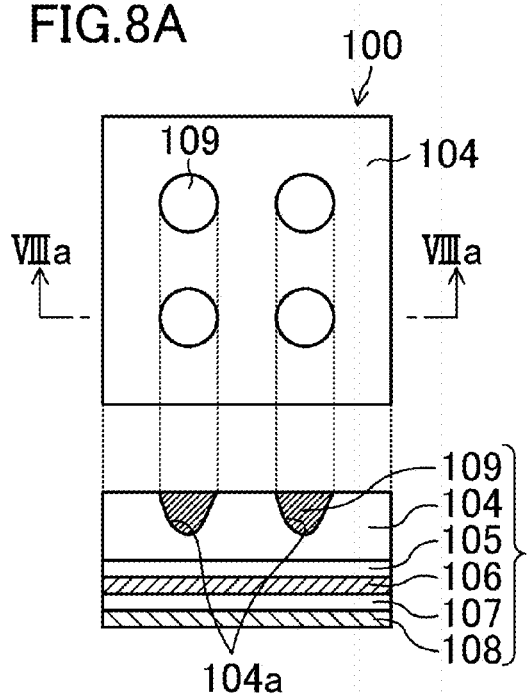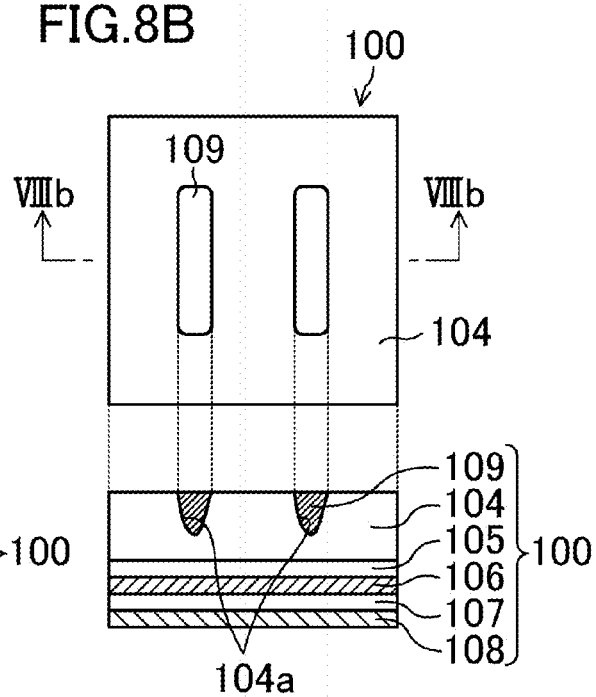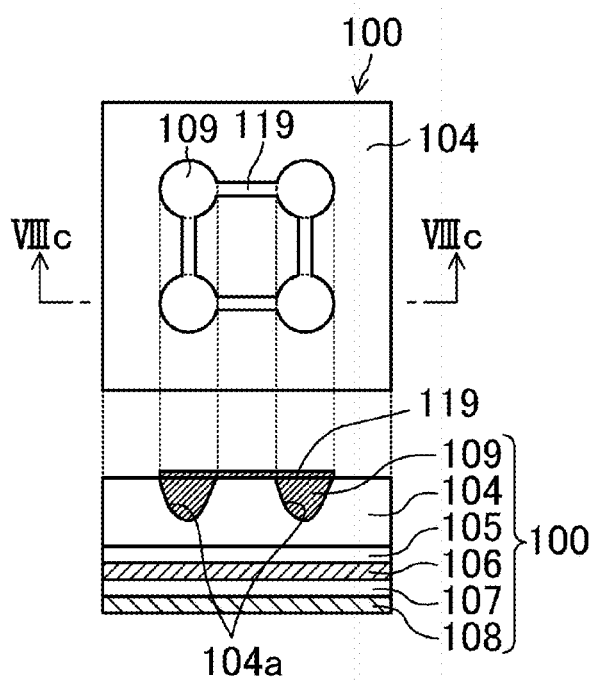

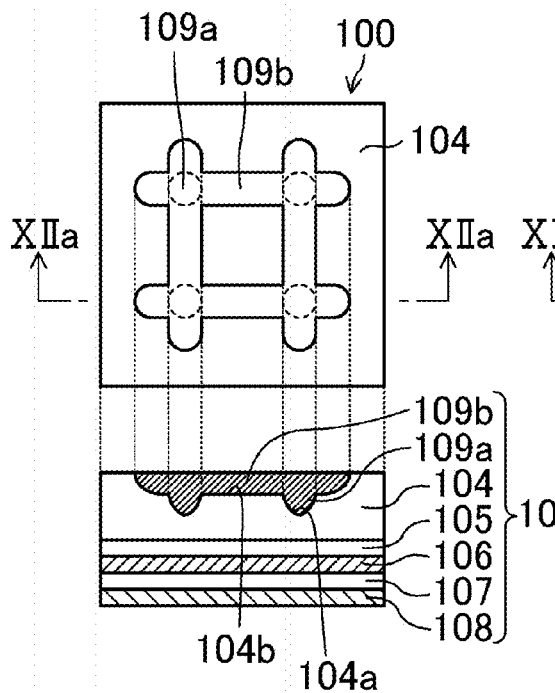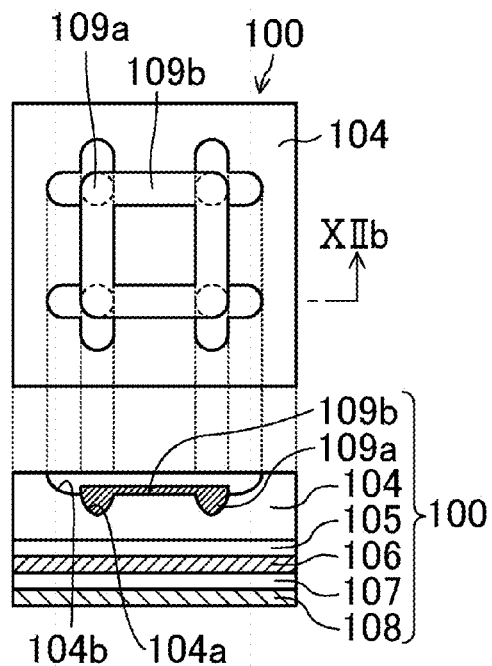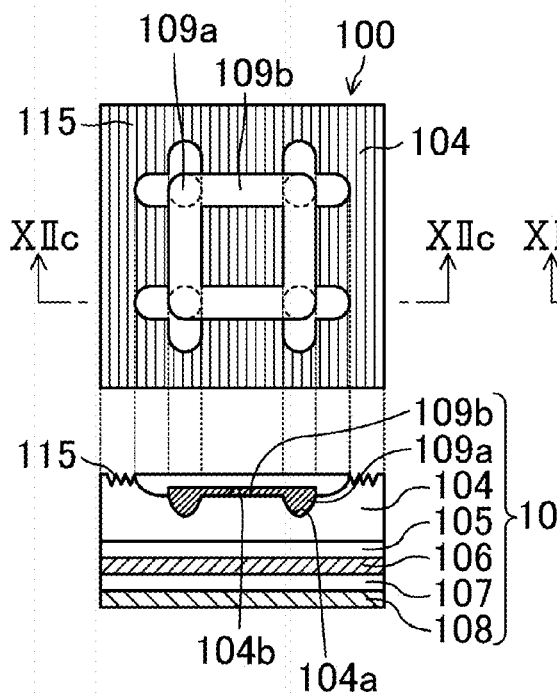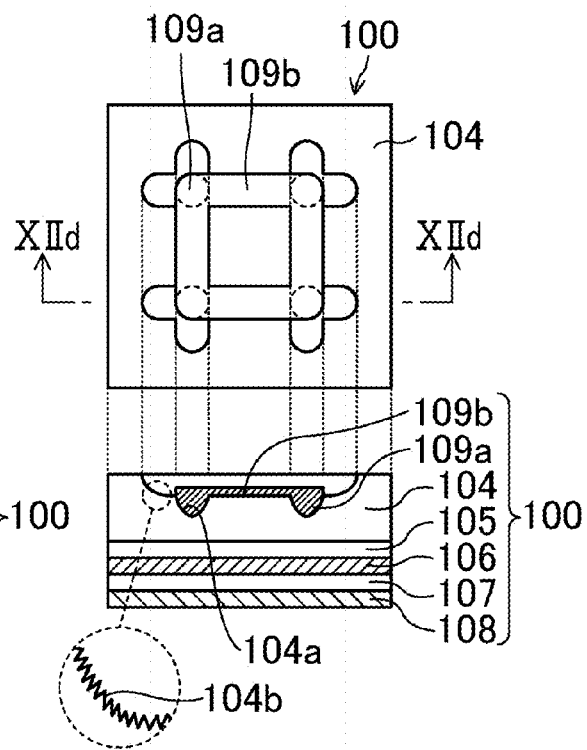

FIG.20A

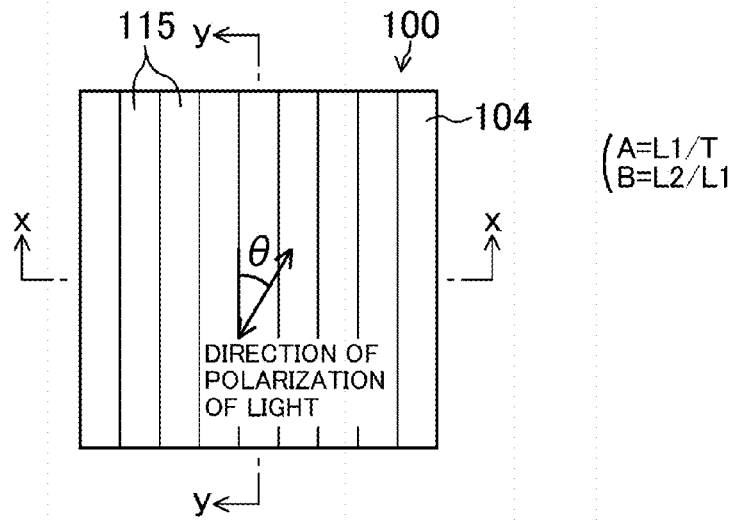

$\begin{cases} A = L1/T \\ B = L2/L1 \end{cases}$

FIG.20B
θ=0°C

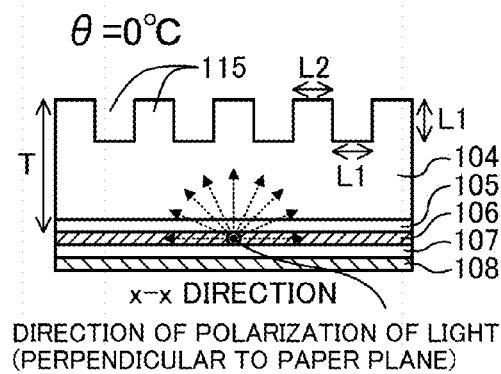

x-x DIRECTION
DIRECTION OF POLARIZATION OF LIGHT
(PERPENDICULAR TO PAPER PLANE)

FIG.20C
θ=0°C

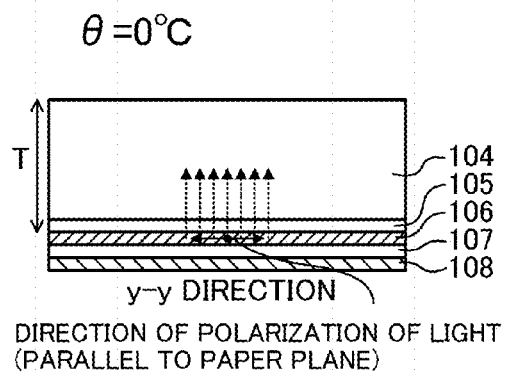

y-y DIRECTION
DIRECTION OF POLARIZATION OF LIGHT
(PARALLEL TO PAPER PLANE)

FIG.20D
θ=90°C

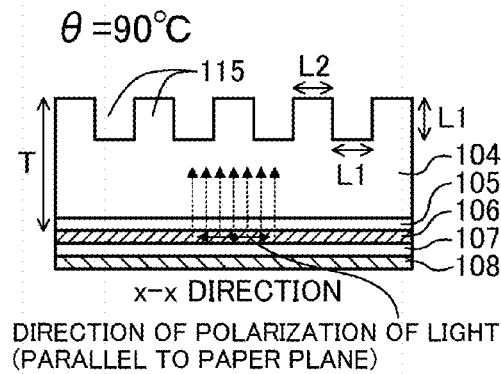

x-x DIRECTION
DIRECTION OF POLARIZATION OF LIGHT
(PARALLEL TO PAPER PLANE)

FIG.20E
θ=90°C

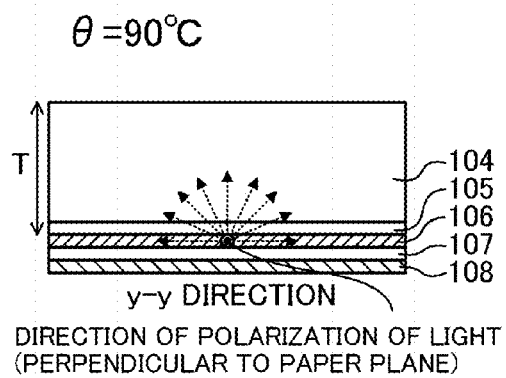

y-y DIRECTION
DIRECTION OF POLARIZATION OF LIGHT
(PERPENDICULAR TO PAPER PLANE)

NITRIDE SEMICONDUCTOR LIGHT EMITTING CHIP, AND NITRIDE SEMICONDUCTOR LIGHT EMITTING DEVICE

CROSS-REFERENCE TO RELATED APPLICATIONS

This is a continuation of International Application No. PCT/JP2012/006754 filed on Oct. 22, 2012, which claims priority to Japanese Patent Application No. 2012-037661 filed on Feb. 23, 2012. The entire disclosures of these applications are incorporated by reference herein.

BACKGROUND

The present disclosure relates to nitride semiconductor light emitting chips, and nitride semiconductor light emitting devices including the same.

Nitride semiconductors containing nitrogen (N) as a group V element have been expected as a material of a short wavelength light emitting element because of their band gap size. Gallium nitride-based compound semiconductors, in particular, have been actively researched, and blue light emitting diodes (LEDs), green LEDs, and blue semiconductor laser diodes that use a gallium nitride-based compound semiconductor have been also commercialized.

Gallium nitride-based compound semiconductors include a compound semiconductor obtained by substituting at least one of aluminum (Al) or indium (In) for part of gallium (Ga). Such a nitride semiconductor is represented by the general formula $Al_xGa_yIn_zN$ (where $0 \leq x, z<1, 0<y \leq 1$, and $x+y+z=1$). The gallium nitride-based compound semiconductors are hereinafter referred to as GaN-based semiconductors.

The replacement of Ga atoms with Al atoms in a GaN-based semiconductor allows the band gap of the GaN-based semiconductor to be wider than that of GaN, and the replacement of Ga atoms with In atoms in a GaN-based semiconductor allows the band gap of the GaN-based semiconductor to be narrower than that of GaN. Thus, not only short wavelength light, such as blue or green light, but also long wavelength light, such as orange or red light, can be emitted. From such a feature, nitride semiconductor light emitting elements have been expected to be used for, e.g., image display devices and lighting devices.

Nitride semiconductors have a wurtzite crystal structure. In FIGS. 1A, 1B, and 1C, the plane orientations of the wurtzite crystal structure are expressed in four-index notation (hexagonal indices). In four-index notation, crystal planes and the orientations of the planes are expressed using primitive vectors expressed as $a_1$, $a_2$, $a_3$, and c. The primitive vector c extends in a [0001] direction, and an axis in this direction is referred to as a "c-axis." A plane perpendicular to the c-axis is referred to as a "c-plane" or a "(0001) plane." FIG. 1A illustrates, not only the c-plane, but also an a-plane (=(11-20) plane) and an m-plane (=(1-100) plane). FIG. 1B illustrates an r-plane (=(1-102) plane), and FIG. 1C illustrates a (11-22) plane. Herein, the symbol "-" attached to the left of one of parenthesized numbers indicating the Miller indices expediently indicates inversion of the number, and corresponds to each of "bars" in some of the drawings.

FIG. 2A illustrates a crystal structure of a GaN-based semiconductor using a ball-and-stick model. FIG. 2B is a ball-and-stick model obtained by observing atomic arrangement in the vicinity of the m-plane surface from an a-axis direction. The m-plane is perpendicular to the plane of the paper of FIG. 2B. FIG. 2C is a ball-and-stick model obtained by observing atomic arrangement of a +c-plane surface from an m-axis direction. The c-plane is perpendicular to the plane of the paper of FIG. 2C. As seen from FIGS. 2A and 2B, N atoms and Ga atoms are located on a plane parallel to the m-plane. On the other hand, as seen from FIGS. 2A and 2C, a layer in which only Ga atoms are located, and a layer in which only N atoms are located are formed on the c-plane.

Conventionally, when a semiconductor element is to be fabricated using a GaN-based semiconductor, a c-plane substrate, i.e., a substrate having a (0001) plane as its principal surface, has been used as a substrate on which a nitride semiconductor crystal is grown. In this case, spontaneous electrical polarization is induced in the nitride semiconductor along the c-axis due to the arrangements of Ga and N atoms. Thus, the "c-plane" is referred to as a "polar plane." As a result of the electrical polarization, a piezoelectric field is generated in a quantum well layer forming a portion of a light emitting layer of a nitride semiconductor light emitting element and made of InGaN along the c-axis. Due to the generated piezoelectric field, the distributed electrons and holes in the light emitting layer are displaced, and the internal quantum efficiency of the light emitting layer is decreased due to a quantum-confined Stark effect of carriers. In order to reduce the decrease in the internal quantum efficiency of the light emitting layer, the light emitting layer formed on the (0001) plane is designed to have a thickness equal to or less than 3 nm.

Furthermore, in recent years, consideration has been made to fabricate a light emitting element using a substrate having an m- or a-plane called a nonpolar plane, or a -r- or (11-22) plane called a semipolar plane as its principal surface. As illustrated in FIG. 1A, m-planes of the wurtzite crystal structure are parallel to the c-axis, and are six equivalent planes orthogonal to the c-plane. For example, in FIG. 1A, a (1-100) plane perpendicular to a [1-100] direction corresponds to one of the m-planes. The other m-planes equivalent to the (1-100) plane include a (-1010) plane, a (10-10) plane, a (-1100) plane, a (01-10) plane, and a (0-110) plane.

As illustrated in FIGS. 2A and 2B, Ga and N atoms on the m-planes are present on the same atomic plane, and thus, electrical polarization is not induced in directions perpendicular to the m-planes. Therefore, when a light emitting element is fabricated using a semiconductor layered structure having an m-plane as its growth surface, a piezoelectric field is not generated in a light emitting layer, and the problem where the internal quantum efficiency is decreased due to the quantum-confined Stark effect of carriers can be solved. This applies also to the a-plane that is a nonpolar plane except the m-planes, and furthermore, even when, instead of the m-plane, the -r- or (11-22) plane called the semipolar plane is used as the growth surface, similar advantages can be provided.

SUMMARY

The luminous efficiency of a light emitting device using a nitride semiconductor crystal has needed to be improved.

It is therefore an object of the present disclosure to improve the luminous efficiency.

In order to achieve the object, a nitride semiconductor light emitting chip according to an aspect of the present disclosure includes: a conductive substrate including a nitride semiconductor layer; an n-type nitride semiconductor layer formed on a principal surface of the nitride semiconductor layer; an active layer formed on the n-type nitride semiconductor layer; a p-type nitride semiconductor layer formed on the active layer; and an n-side electrode formed in contact with the conductive substrate. A plurality of recesses are formed in separate regions of a back surface of the conductive substrate opposite to the principal surface, the n-side electrode is in contact with at least part of a surface of one of the recesses, and a depth D1 is greater than or equal to 25% of a thickness T, where T represents a thickness of the conductive substrate, and D1 represents a depth of the recess.

According to the present disclosure, the luminous efficiency can be improved.

BRIEF DESCRIPTION OF THE DRAWINGS

FIGS. 2A-2C are diagrams illustrating a crystal structure of a GaN-based semiconductor using a ball-and-stick model.

FIGS. 7A-7D are schematic plan views and cross-sectional views illustrating other variations of the n-side electrode included in the nitride semiconductor light emitting chip according to the first embodiment.

FIGS. 8A-8C are schematic plan views and cross-sectional views illustrating variations of the placement of n-side electrodes included in the nitride semiconductor light emitting chip according to the first embodiment.

FIGS. 12A-12D are schematic plan views and cross-sectional views illustrating variations of a nitride semiconductor light emitting chip according to the third embodiment.

FIG. 20A is a plan view schematically illustrating light extraction when a striped uneven structure is provided within the path of emitted light having polarization characteristics, and FIGS. 20B-20E are cross-sectional views schematically illustrating the same.

DETAILED DESCRIPTION

Figure 1A:
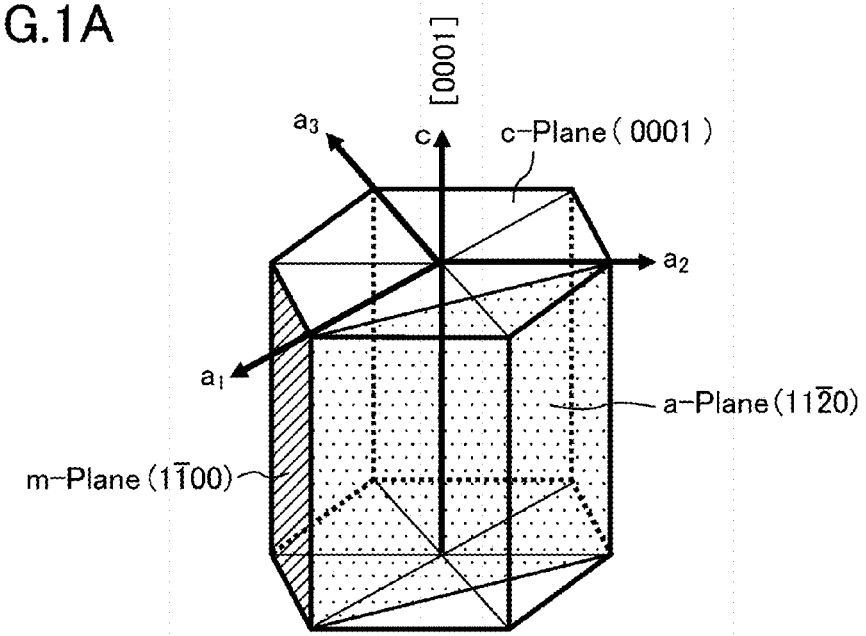
FIG. 1A is a perspective view illustrating primitive vectors $a_1$, $a_2$, $a_3$, and c, and a-, c-, and m-planes of a wurtzite crystal structure.
Figure 1B:
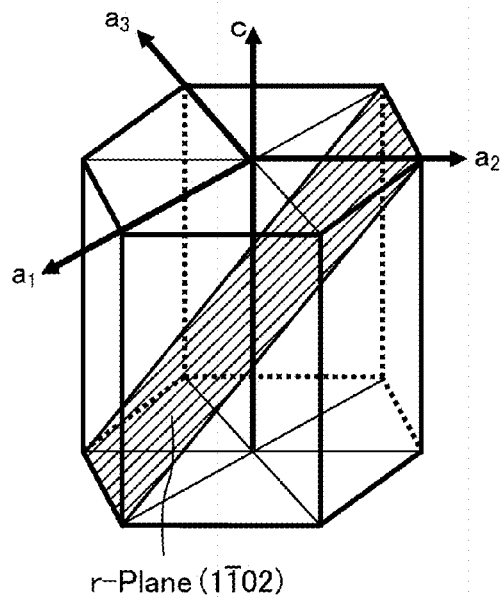
FIG. 1B is a perspective view illustrating an r-plane of the wurtzite crystal structure.
Figure 1C:
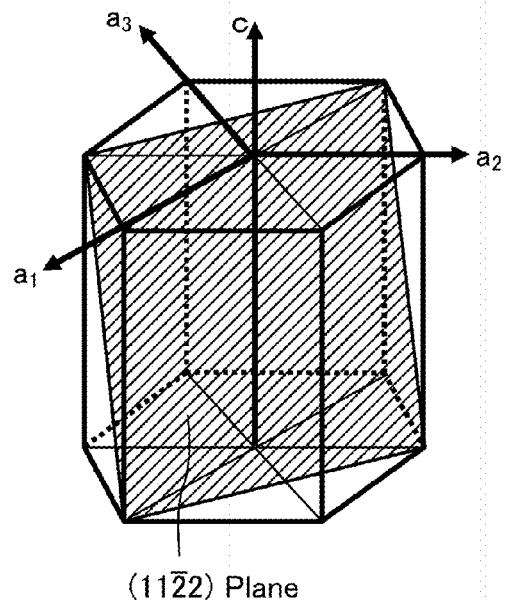
FIG. 1C is a perspective view illustrating a (11-22) plane of the wurtzite crystal structure.

In an embodiment of the present disclosure, a nitride semiconductor light emitting chip includes: a conductive substrate including a nitride semiconductor layer; an n-type nitride semiconductor layer formed on a principal surface of the nitride semiconductor layer; an active layer formed on the n-type nitride semiconductor layer; a p-type nitride semiconductor layer formed on the active layer; and an n-side electrode formed in contact with the conductive substrate. A plurality of recesses are formed in separate regions of a back surface of the conductive substrate opposite to the principal surface, the n-side electrode is in contact with at least part of a surface of one of the recesses, and a depth D1 is greater than or equal to 25% of a thickness T, where T represents a thickness of the conductive substrate, and D1 represents a depth of the recess.

The depth D1 may be greater than or equal to 44% of the thickness T.

The depth D1 may be greater than or equal to 57% of the thickness T.

The depth D1 may be greater than or equal to 76% of the thickness T.

The thickness T may be not less than 80 μm and not more than 200 μm.

The thickness T may be not less than 100 μm and not more than 150 μm.

At least one of the recesses may be placed per an area of 22500 μm$^2$ of the nitride semiconductor light emitting chip when viewed in plan.

At least one of the recesses may be placed per an area of 10000 μm$^2$ of the nitride semiconductor light emitting chip when viewed in plan.

A contact area between the n-side electrode and the surface of the corresponding recess may be not less than 5% of an area of the nitride semiconductor light emitting chip when viewed in plan and not more than 18% of the area.

The conductive substrate may include a minute first uneven structure provided on the surface of each of the recesses.

The recesses may be grooves each extending in one direction, and an angle θ1 may be not less than 25° and not more than 90°, where θ1 represents an angle formed between a direction of extension of the grooves and a direction of polarization of light from the active layer.

The angle θ1 may be not less than 45° and not more than 90°.

The angle θ1 may be substantially 90°.

A second uneven structure may be provided on a region of the back surface of the conductive substrate in which the recesses are not formed, and the second uneven structure may be smaller than a depth of each of the recesses.

The second uneven structure may have a striped structure, and an angle θ2 may be not less than 0° and not more than 45°, where θ2 represents an angle formed between a direction of extension of the striped structure and a direction of polarization of light from the active layer.

The angle θ2 may be not less than 0° and not more than 25°.

The angle θ2 may be substantially 0°.

A first groove and a second groove crossing each other may be formed in the back surface of the conductive substrate, and the first and second grooves may be connected to one of the recesses at a point of intersection of the first and second grooves.

In another embodiment of the present disclosure, a nitride semiconductor light emitting chip includes: a conductive substrate including a nitride semiconductor layer; an n-type nitride semiconductor layer formed on a principal surface of the nitride semiconductor layer; an active layer formed on the n-type nitride semiconductor layer; a p-type nitride semiconductor layer formed on the active layer; and an n-side electrode formed in contact with the conductive substrate. The conductive substrate has a recess formed in a back surface of the conductive substrate opposite to the principal surface, and a first groove and a second groove formed in the back surface to cross each other, the first and second grooves are connected to the recess at a point of intersection of the first and second grooves, the n-side electrode is in contact with at least part of a surface of the recess, and a depth D1 is not less than 25% of a thickness T, where T represents a thickness of the conductive substrate, and D1 represents a depth of the recess.

The depth D1 of the recess may be about twice a depth D2 of each of the first and second grooves.

The nitride semiconductor layer may have a nonpolar or semipolar plane as its principal surface, and the active layer may emit polarized light.

In still another embodiment of the present disclosure, a nitride semiconductor light emitting device includes: a mounting substrate holding the nitride semiconductor light emitting chip or the nitride semiconductor light emitting chip including a plurality of nitride semiconductor light emitting chips; an electrode layer formed on the mounting substrate; a connection member electrically connecting the nitride semiconductor light emitting chip with the electrode layer; and a light-transmissive member covering the nitride semiconductor light emitting chip, wherein the back surface of the conductive substrate serves as a light extraction surface.

The n-side electrode may be further in contact with at least part of a principal surface of a portion of the conductive substrate except a portion of the conductive substrate in which the recess is formed, a surface of the second uneven structure, a surface of the first groove, or a surface of the second groove, and the connection member may be a wire connected to the n-side electrode on the principal surface of the portion of the conductive substrate except the portion of the conductive substrate in which the recess is formed, the surface of the second uneven structure, the surface of the first groove, or the surface of the second groove.

The light-transmissive member may contain a phosphor configured to convert a wavelength of light emitted from the active layer.

In yet another embodiment of the present disclosure, a method for fabricating a nitride semiconductor chip includes forming a recess by a grinding process or a thermal melting process.

Grinding using a dicing blade may be used as the grinding process.

Thermal melting using laser light may be used as the thermal melting process.

Incidentally, the nitride semiconductor active layer having an m-plane as a growth surface emits light with electric field intensity varying principally along the a-axis.

The polarization direction of light from a nitride semiconductor active layer having an a-plane as a growth surface has been known to be along the m-axis.

The polarization direction of light from a nitride semiconductor active layer having a (20-2-1) or (20-21) plane that is a semipolar plane as a growth surface has been known to correspond to the [-12-10] direction.

When the indium (In) content of a nitride semiconductor active layer having a (10-1-3) plane that is a semipolar plane as a growth surface is high, the polarization direction of light from the nitride semiconductor active layer has been known to correspond to the [-12-10] direction, and when the In content of the nitride semiconductor active layer is low, the polarization direction of the light has been known to correspond to the [11-23] direction.

When the In content of a nitride semiconductor active layer having a (11-22) plane that is a semipolar plane as a growth surface is high, the polarization direction of light from the nitride semiconductor active layer has been known to be along the m-axis, and when the In content of the nitride semiconductor active layer is low, the polarization direction of the light has been known to correspond to the [-1-123] direction.

Herein, a conductive substrate having a GaN layer having an m-plane as the principal surface is used as an example. However, similar statements apply to a conductive substrate having a GaN layer having a semipolar plane, such as a -r-, (20-21), (20-2-1), (10-1-3), or (11-22) plane, or a nonpolar plane, such as an a-plane, as the principal surface.

In the present disclosure, "m-planes" include not only planes completely parallel to the m-planes, but also planes inclined at an angle of about ±5° or less from the m-planes. Planes inclined slightly from the m-planes are much less affected by spontaneous electrical polarization. In addition, in some cases, in a crystal growth technique, a semiconductor layer is more easily epitaxially grown on a substrate having a crystal orientation inclined slightly from a desired orientation than on a substrate having a crystal orientation exactly identical to the desired orientation. Therefore, it may be useful to slightly incline a crystal plane in order to improve the crystal quality of the semiconductor layer to be epitaxially grown or increase the crystal growth rate of the semiconductor layer while reducing the influence of spontaneous electrical polarization to a sufficient level.

Similar statements apply to "a-planes," "(20-21) planes," "(20-2-1) planes," "(10-1-3) planes," "-r-planes," and "(11-22) planes," and thus, the "a-planes," the "(20-21) planes," the "(20-2-1) planes," the "(10-1-3) planes," the "-r-planes," and the "(11-22) planes" herein each include not only planes completely parallel to corresponding ones of the "a-planes," the "(20-21) planes," the "(20-2-1) planes," the "(10-1-3) planes," the "-r-planes," and the "(11-22) planes," but also planes inclined at an angle of about ±5° or less from the corresponding ones of the "a-planes," the "(20-21) planes," the "(20-2-1) planes," the "(10-1-3) planes," the "-r-planes," and the "(11-22) planes."

Studies of the present inventors have revealed a problem where since a conventional nitride semiconductor light emitting chip using a nitride semiconductor substrate having a nonpolar plane or a semipolar plane as the principal surface has a substrate with high resistivity, and furthermore, the substrate thickness cannot be reduced, the operating voltage cannot be reduced. It has been clear that in particular, in a nitride semiconductor light emitting chip which includes a p-side electrode facing a mounting substrate, and an n-side electrode formed on a back surface of a conductive substrate, and through which current is passed in a direction perpendicular to the substrate plane, the substrate resistance significantly affects the operating voltage. Furthermore, it has been clear that the placement of the n-side electrode on the substrate significantly affects light extraction.

A nitride semiconductor laser element described in Japanese Unexamined Patent Publication No. 2010-177455 has a nitride semiconductor substrate having a back surface including 2-10-μm-deep grooves and a flat part having a nitrogen polarity in order to form a back electrode exhibiting good ohmic contact performance, high adhesiveness, and high heat resistance.

For example, Japanese Unexamined Patent Publication No. 2002-299769 describes a nitride semiconductor laser element having a nitride semiconductor substrate having a back surface in which recesses having a depth of about several through 10 μm are formed to increase the surface area of the substrate to three or more times its original value in order to improve the heat dissipation performance and reliability.

For example, Japanese Unexamined Patent Publication No. 2002-16312 describes a nitride semiconductor laser element including an electrode formation region on which in order to reduce the contact resistance, projections/recesses having a depth of about several hundred nm through several μm are formed to increase the contact area.

However, in the nitride semiconductor laser structures which are described in Japanese Unexamined Patent Publication No. 2010-177455, Japanese Unexamined Patent Publication No. 2002-299769, and Japanese Unexamined Patent Publication No. 2002-16312 and through which current is passed in a direction perpendicular to the substrate plane, a surface of the substrate itself does not serve as a light extraction surface, and thus, the area of the n-side electrode can be increased to an adequate level. Therefore, the substrate resistance is insignificant.

In contrast, in the case of a light emitting diode element in which current is passed from a p-side electrode to an n-side electrode in a direction perpendicular to the substrate plane by using a nitride semiconductor crystal having a nonpolar plane or a semipolar plane as the principal surface, the area of the n-side electrode formed on a light extraction surface cannot be increased. Furthermore, since a conductive substrate has a relatively large thickness and a high resistivity, the resistance of the light emitting element is determined by the resistances of an n-type nitride semiconductor layer and the substrate, and thus, the operating voltage cannot be decreased, thereby decreasing the luminous efficiency, such as power utilization efficiency.

An example in which the principal surface is a nonpolar plane or a semipolar plane, and polarized light is emitted from an active layer will be described hereinafter. However, in embodiments of the present disclosure, also when a polar plane is the principal surface, and polarized light is not emitted from an active layer, the resistance can be, of course, reduced.

First Embodiment

A semiconductor light emitting device according to a first embodiment will be described hereinafter with reference to FIGS. 3A and 3B.

Figure 3A:
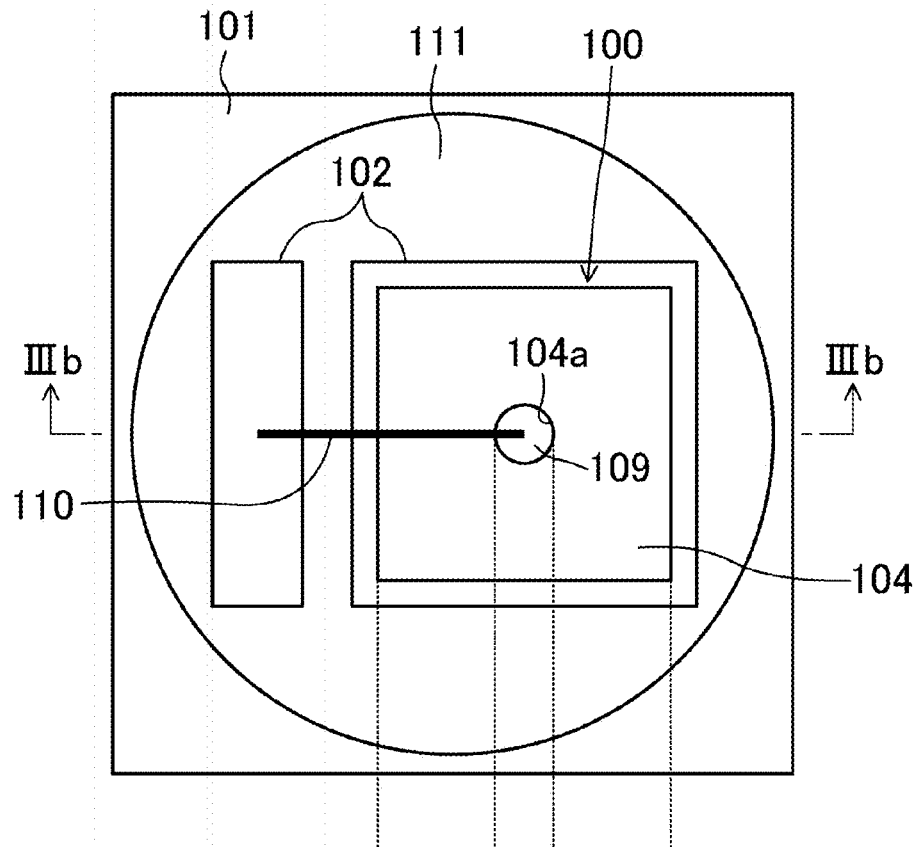
FIG. 3A is a schematic plan view illustrating a nitride semiconductor light emitting device according to a first embodiment.

FIG. 3A schematically illustrates a plan configuration of a nitride semiconductor light emitting device according to the first embodiment. FIG. 3B schematically illustrates a cross-sectional configuration taken along the line IIIb-IIIb in FIG. 3A.

Figure 3B:
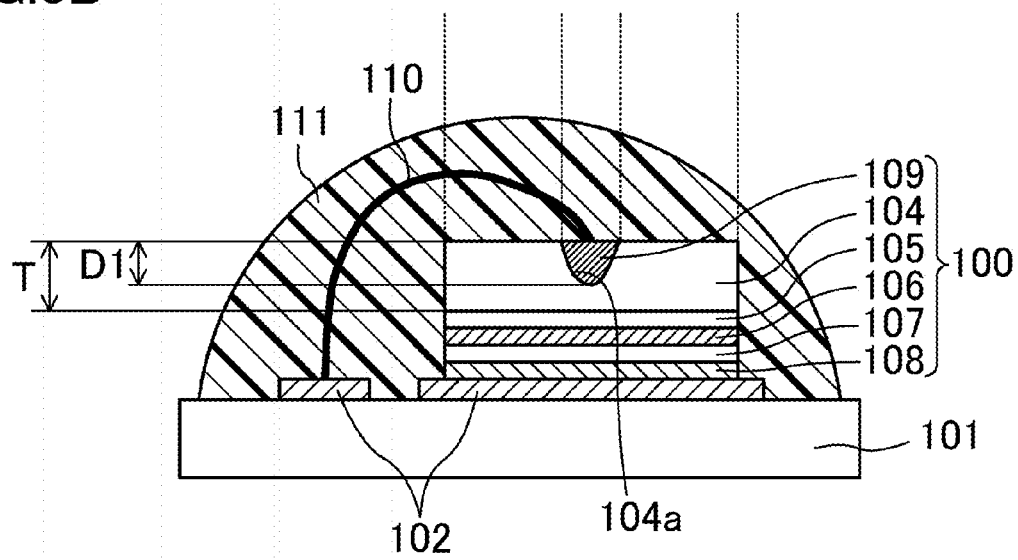
FIG. 3B is a schematic cross-sectional view taken along the line IIIb-IIIb in FIG. 3A.

As illustrated in FIGS. 3A and 3B, the nitride semiconductor light emitting device according to the first embodiment includes a mounting substrate 101, interconnect electrode layers 102 selectively formed on the mounting substrate 101, a nitride semiconductor light emitting chip 100 fixed and mounted on one of the interconnect electrode layers 102 on the mounting substrate 101, a wire 110 that is a connection member connecting the nitride semiconductor light emitting chip 100 with the other one of the interconnect electrode layers 102, and a light-transmissive member 111 covering the interconnect electrode layers 102, the wire 110, and the nitride semiconductor light emitting chip 100.

As illustrated in FIG. 3B, the nitride semiconductor light emitting chip 100 includes a p-side electrode 108 connected onto the interconnect electrode layer 102, and is mounted on the interconnect electrode layer 102 so as to form a junction down interconnection or a flip-chip interconnection. Therefore, here, the nitride semiconductor light emitting chip 100 includes a conductive substrate 104 having a GaN layer having an m-plane as the principal surface (hereinafter referred to as the m-plane GaN layer), and a plurality of nitride semiconductor layers epitaxially grown on the lower surface of the conductive substrate 104.

Specifically, the nitride semiconductor light emitting chip 100 includes an n-type nitride semiconductor layer 105 formed on the principal surface of the m-plane GaN layer of the conductive substrate 104, an active layer 106 formed on the n-type nitride semiconductor layer 105 and made of a nitride semiconductor, a p-type nitride semiconductor layer 107 formed on the active layer 106, a p-side electrode 108 formed on and in contact with the p-type nitride semiconductor layer 107, and an n-side electrode 109 formed in contact with the inner surface of a recess 104a formed in the back surface of the conductive substrate 104 (opposite to the principal surface thereof).

FIGS. 3A and 3B illustrate an example, and a surface of the GaN layer corresponding to the principal surface of the conductive substrate 104 may be a nonpolar plane or a semipolar plane. In this case, the active layer 106 emits polarized light.

A GaN substrate having a nonpolar plane or a semipolar plane as the principal surface can be used as the conductive substrate 104. Alternatively, instead of the GaN substrate, a silicon carbide (SiC) substrate, or a digallium trioxide ($Ga_2O_3$) substrate can be used. In this case, the plane orientation needs to be selected to allow a nonpolar or semipolar plane of GaN grown on the principal surface of the conductive substrate 104 to correspond to a growth surface. The thickness of the conductive substrate 104 may be not less than 80 μm and not more than 200 μm. The thickness may be not less than 100 μm and not more than 150 μm. When the thickness of the conductive substrate 104 is not less than 80 μm, this can reduce the risk of breaking the conductive substrate 104 during handling in a fabrication process. Furthermore, when the thickness of the conductive substrate 104 is not more than 200 μm, this reduces the substrate resistance, and facilitates singulating the conductive substrate 104. When, as such, a conductive substrate is used as a substrate for epitaxial growth of nitride semiconductor layers, current can be passed from the p-side electrode 108 to the n-side electrode 109 in a direction perpendicular to the substrate plane. However, in view of ease of handling, it is difficult to reduce the thickness of the conductive substrate 104 to an adequate level.

The growth surface of each of the n-type nitride semiconductor layer 105, the active layer 106, and the p-type nitride semiconductor layer 107 is substantially parallel to m-planes. In other words, the semiconductor layers 105, 106, and 107 are stacked along the m-axis. Another semiconductor layer may be formed between the n-type nitride semiconductor layer 105 and the active layer 106. Furthermore, another semiconductor layer may be formed between the active layer 106 and the p-type nitride semiconductor layer 107. Here, a semiconductor made of a gallium nitride-based compound (hereinafter referred to as the GaN-based semiconductor) will be described as an example nitride semiconductor. The GaN-based semiconductor includes a semiconductor represented by the general expression $Al_xIn_yGa_zN$ (where $0 \leq x$, $y < 1$, $0 < z \leq 1$, and $x+y+z=1$).

As illustrated in FIGS. 3A and 3B, the nitride semiconductor light emitting chip 100 is mounted such that the p-side electrode 108 is connected to one of the interconnect electrode layers 102 on the mounting substrate 101. The n-side electrode 109 and the other one of the interconnect electrode layers 102 are connected together through the wire 110. An insulative material, such as alumina (aluminum oxide), aluminum nitride (AlN), or a glass epoxy resin, a metal material containing, e.g., aluminum (Al), copper (Cu), or tungsten (W), a semiconductor material, such as silicon (Si) or germanium (Ge), or a composite of the materials can be used as the principal material forming the mounting substrate 101. Metal, such as aluminum (Al), silver (Ag), gold (Au), or copper (Cu), can be used as a material of the interconnect electrode layers 102. Metal, such as aluminum (Al), gold (Au), or copper (Cu), can be used as the wire 110.

A resin material, such as an epoxy resin or a silicone resin, capable of encapsulating the nitride semiconductor light emitting chip 100, the wire 110, and other components, can be used as a material of the light-transmissive member 111. FIG. 3B illustrates an example in which the light-transmissive member 111 is semispherical. The light-transmissive member 111 may have an optional shape, such as a shape obtained by distorting the semispherical shape, or a cubic shape. Furthermore, the light-transmissive member 111 may contain phosphors.

The n-type nitride semiconductor layer 105 is made of, e.g., n-type $Al_uGa_vIn_wN$ (where $0 \leq u$, v, $w \leq 1$ and $u+v+w=1$). For example, silicon (Si) can be used as an n-type dopant.

The active layer 106 includes a plurality of barrier layers made of $In_yGa_{1-y}N$ (where $0 \leq Y \leq 1$), and at least one well layer vertically interposed between an adjacent pair of the barrier layers and made of $In_xGa_{1-x}N$ (where $0 \leq x \leq 1$). The well layer included in the active layer 106 may be a single layer. Alternatively, the active layer 106 may have a multiple quantum well (MQW) structure in which well layers and barrier layers are alternately stacked. The wavelength of light emitted from the nitride semiconductor light emitting chip 100 depends on the In content x of an $In_xGa_{1-x}N$ semiconductor that is a semiconductor composition of the well layer.

The p-type nitride semiconductor layer 107 is made of, e.g., a p-type $Al_sGa_tN$ (where $0 \leq s$, $t \leq 1$ and $s+t=1$) semiconductor. For example, magnesium (Mg) can be used as a p-type dopant. As the p-type dopant, instead of Mg, zinc (Zn) or beryllium (Be), for example, may be used. The Al content s of the p-type nitride semiconductor layer 107 may be uniform along the thickness thereof, or may vary along the thickness thereof in a continuous or stepwise manner. The thickness of the p-type nitride semiconductor layer 107 is, e.g., about 0.05-2 μm. The Al content s of a portion of the p-type nitride semiconductor layer 107 near an upper surface thereof, i.e., a portion thereof near the interface between the p-type nitride semiconductor layer 107 and the p-side electrode 108, may be zero. In other words, the portion of the p-type nitride semiconductor layer 107 near the upper surface thereof may be made of GaN. In this case, GaN may contain a high concentration of p-type impurities, and may function as a contact layer with the p-side electrode 108.

The p-side electrode 108 may cover substantially the entire surface of the p-type nitride semiconductor layer 107. The p-side electrode 108 is made of, e.g., a layered structure (Pd/Pt) in which a palladium (Pd) layer and a platinum (Pt) layer are stacked. In order to increase the reflectivity of emitted light, a layered structure (Ag/Pt) in which a silver (Ag) layer and a platinum (Pt) layer are stacked, or a layered structure (Pd/Ag/Pt) in which a Pd layer, an Ag layer, and a Pt layer are sequentially stacked may be used as the p-side electrode 108.

The n-side electrode 109 is made of, e.g., a layered structure (Ti/Pt) in which a titanium (Ti) layer and a platinum (Pt) layer are stacked. In order to increase the reflectivity of emitted light, a layered structure (Ti/Al/Pt) in which a Ti layer, an Al layer, and a Pt layer are sequentially stacked may be used.

The nitride semiconductor light emitting chip 100 illustrated in FIGS. 3A and 3B is one of squared pieces (chips) into which a wafer including epitaxially grown semiconductor layers is singulated along the a- and c-axes. In this case, a c-plane of a nitride semiconductor is easily cleaved, and thus, a singulation process step can be simplified. Alternatively, the nitride semiconductor light emitting chip 100 may be one of pieces into which the wafer is singulated along directions inclined about 0-45° from the a- and c-axes. In this case, planes that are difficult to be cleaved are exposed on the side surfaces of the nitride semiconductor light emitting chip 100. This exposure tends to cause the side surfaces of the nitride semiconductor light emitting chip 100 to be uneven. The uneven side surfaces improve the light extraction efficiency at which emitted light is extracted from the side surfaces.

As described above, light emitted from the semiconductor light emitting chip 100 including the active layer 106 having the m-plane as its principal surface (and the growth surface) and made of a nitride semiconductor has polarization characteristics in which the a-axis corresponds to the polarization direction of the light.

In this embodiment, the recess 104a is formed in the back surface of the conductive substrate 104, and the n-side electrode 109 is formed in contact with the inner surface of the recess 104a. The depth D1 is not less than 25% of the thickness T, where T represents the thickness of the conductive substrate 104, and D1 represents the distance from the back surface of the conductive substrate 104 to the bottom of the recess 104a (the depth of the recess).

When the depth D1 is not less than 25% of the thickness T, the substrate resistance can be about 5-10% lower than when no recess 104a is formed.

When the depth D1 is not less than 44% of the thickness T, the substrate resistance can be about 10-20% lower than when no recess 104a is formed.

When the depth D1 is not less than 57% of the thickness T, the substrate resistance can be about 17-30% lower than when no recess 104a is formed.

When the depth D1 is not less than 76% of the thickness T, the substrate resistance can be about 30-50% lower than when no recess 104a is formed.

First Variation of First Embodiment

Figure 4A:
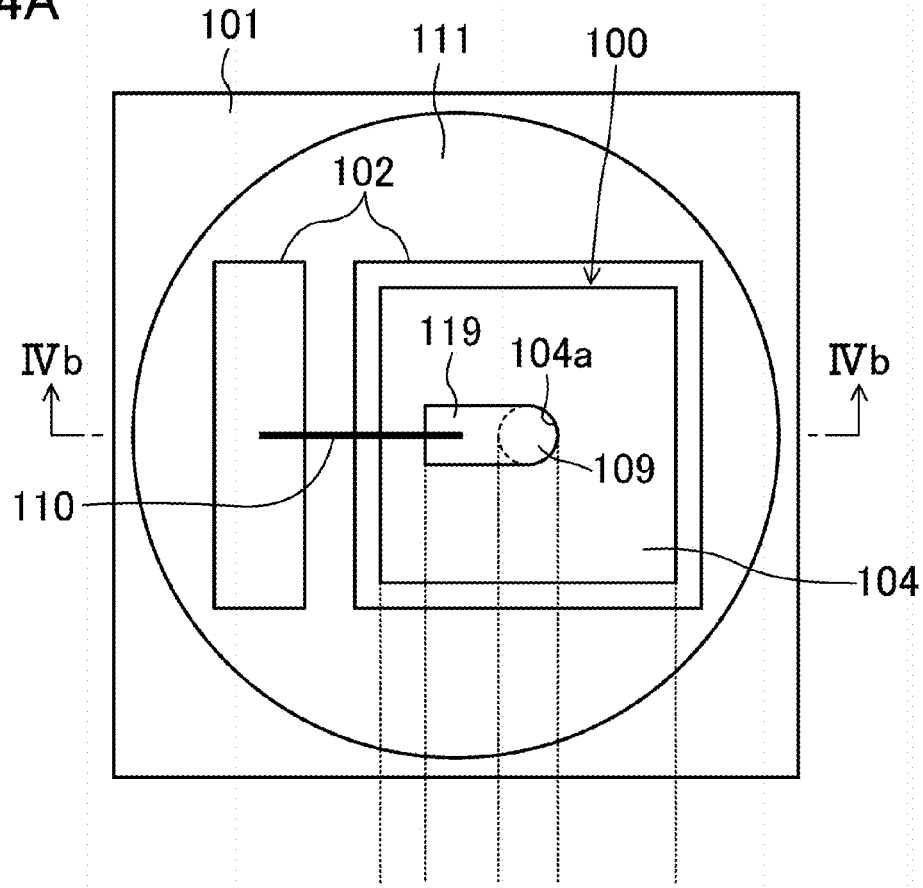
FIG. 4A is a schematic plan view illustrating a nitride semiconductor light emitting device according to a first variation of the first embodiment.
Figure 4B:
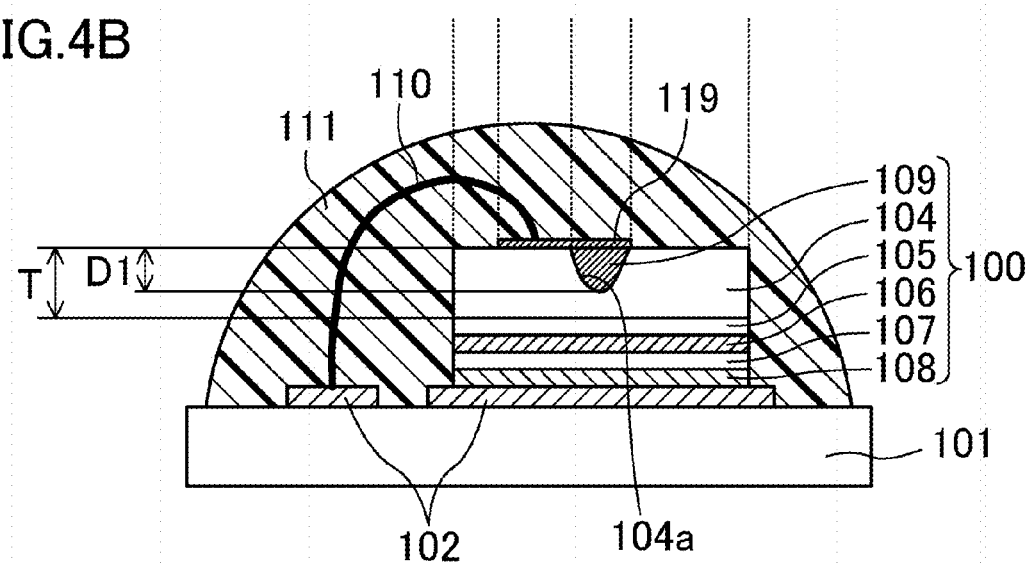
FIG. 4B is a schematic cross-sectional view taken along the line IVb-IVb in FIG. 4A.

FIG. 4A schematically illustrates a plan configuration of a nitride semiconductor light emitting device according to a first variation of the first embodiment. FIG. 4B schematically illustrates a cross-sectional configuration taken along the line IVb-IVb in FIG. 4A.

As illustrated in FIGS. 4A and 4B, a nitride semiconductor light emitting chip 100 according to this variation includes an electrode (extraction electrode) 119 formed on the back surface of a conductive substrate 104 to be in contact with an n-side electrode 109. In this variation, one of interconnect electrode layers 102 and the electrode 119 are connected together through a wire 110. Therefore, the wire 110 can be formed, not on the n-side electrode 109 formed on the inner surface of the recess 104a, but on the electrode 119 located on a thick region of the conductive substrate 104. This makes it difficult for damage caused by the formation of the wire 110 to reach the active layer 106.

When a metal material similar to the material of the n-side electrode 109 is used as the electrode 119, this increases the contact area between the electrode 119 and the back surface of the conductive substrate 104, and thus, the contact resistance between the conductive substrate 104 and the n-side electrode 109 can be reduced. An electrode of, e.g., gold (Au), aluminum (Al), or silver (Ag) that is difficult to make ohmic contact with the back surface of the conductive substrate 104 can be used as the electrode 119.

(Variations of Planar Shape of N-Side Electrode) FIGS. 5A-5D illustrate variations of the planar shape of the n-side electrode 109 included in the nitride semiconductor light emitting chip according to the first embodiment. FIGS. 5A-5D each illustrate only the nitride semiconductor light emitting chip 100. FIGS. 3A and 4A each illustrate the circular n-side electrode 109 in plan view as an example. However, as described below, the n-side electrode 109 can form any one of various shapes.

Figure 5A:
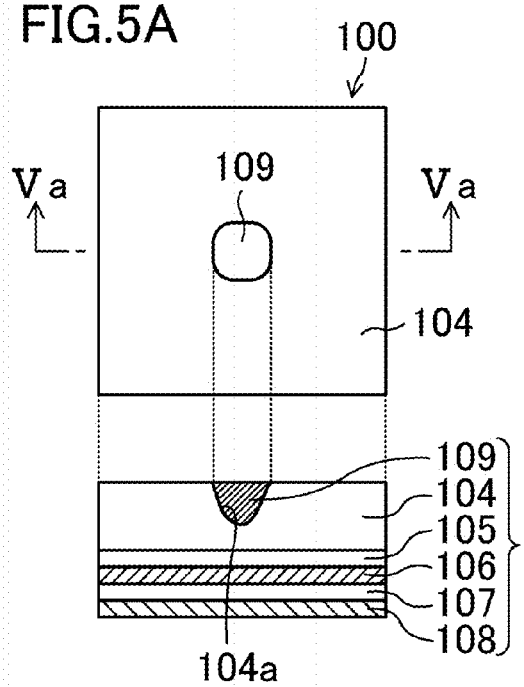
FIGS. 5A-5D are schematic plan views and cross-sectional views illustrating variations of an n-side electrode included in the nitride semiconductor light emitting chip according to the first embodiment.
Figure 5B:
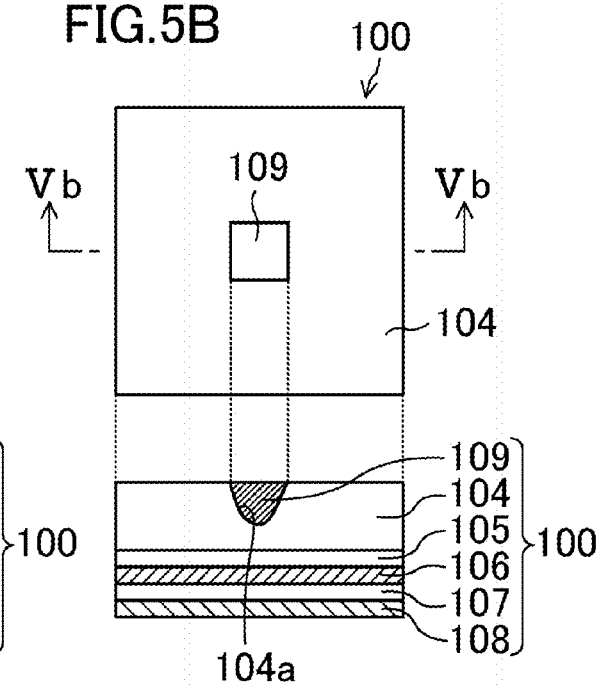
Figure 5C:
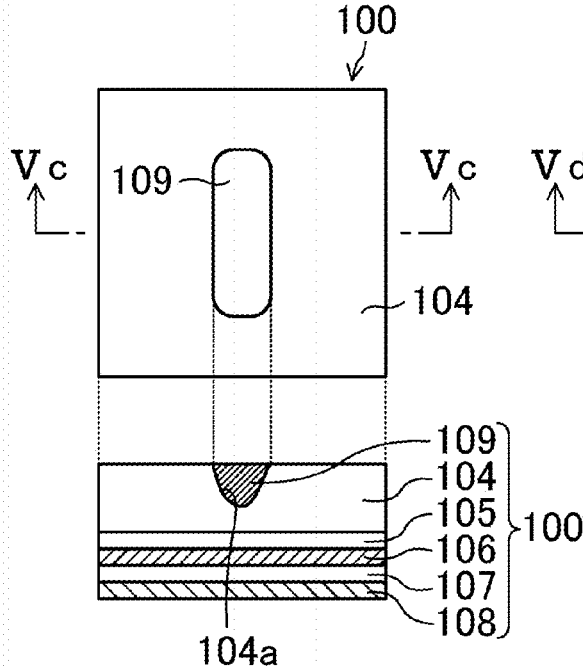
Figure 5D:
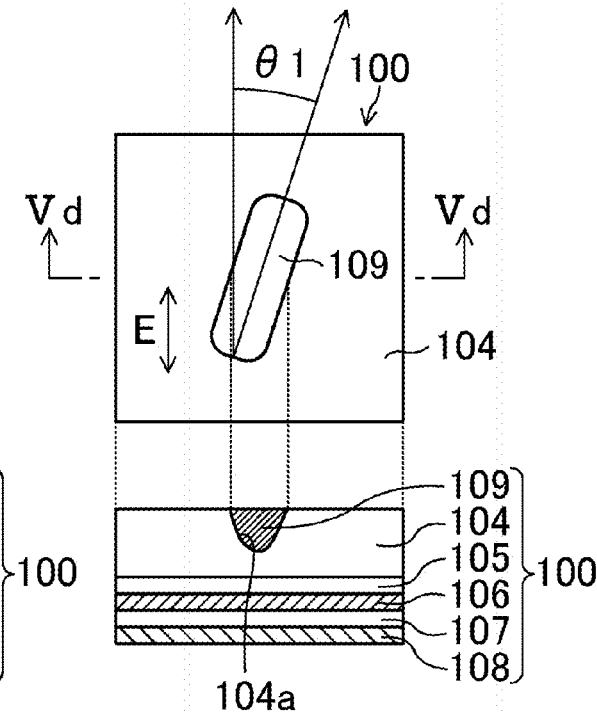

For example, FIG. 5A illustrates an example in which the n-side electrode 109 forms a distorted circular shape as viewed in plan. FIG. 5B illustrates an example in which the n-side electrode 109 is rectangular as viewed in plan. FIG. 5C illustrates an example in which the n-side electrode 109 forms, e.g., an elliptical shape extending in a specific direction as viewed in plan. FIG. 5D illustrates an example in which the n-side electrode 109 forms an elliptical shape extending in a specific direction as viewed in plan, and an angle $\theta 1$ is formed between the direction of the extension and the direction of polarization of light from the active layer 106. Here, the angle $\theta 1$ may be 25-90°. The angle $\theta 1$ may be 45-90°. The angle $\theta 1$ may be substantially 90°. Although the light output may be decreased due to the n-side electrode 109 blocking the light emitted from the active layer 106, the formation of such an angle $\theta 1$ therebetween can reduce such a decrease in light output.

(Variations of Cross-Sectional Shape of N-Side Electrode)

FIGS. 6A-7D illustrate variations of the cross-sectional shape of the n-side electrode 109 included in the nitride semiconductor light emitting chip according to the first embodiment. FIGS. 6A-7D each illustrate only the nitride semiconductor light emitting chip 100. FIGS. 3B and 4B each illustrate the generally semicircular n-side electrode 109 in cross-sectional view as an example. However, as described below, the n-side electrode 109 can form any one of various shapes.

Figure 6A:
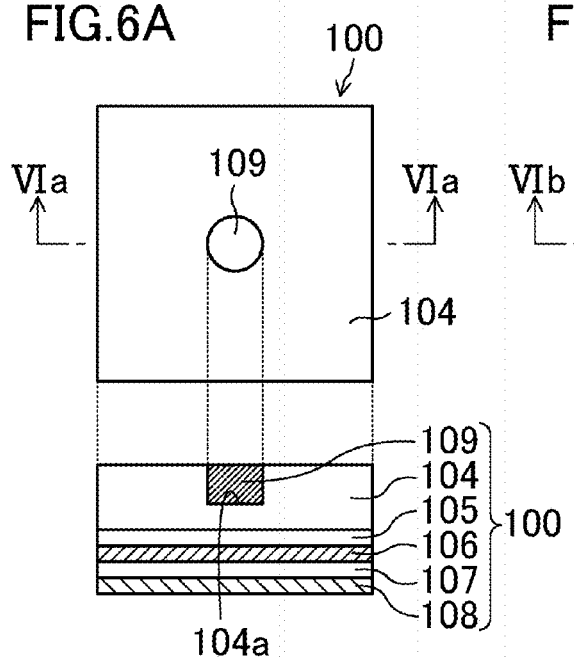
FIGS. 6A-6C are schematic plan views and cross-sectional views illustrating variations of the n-side electrode included in the nitride semiconductor light emitting chip according to the first embodiment.
Figure 6B:
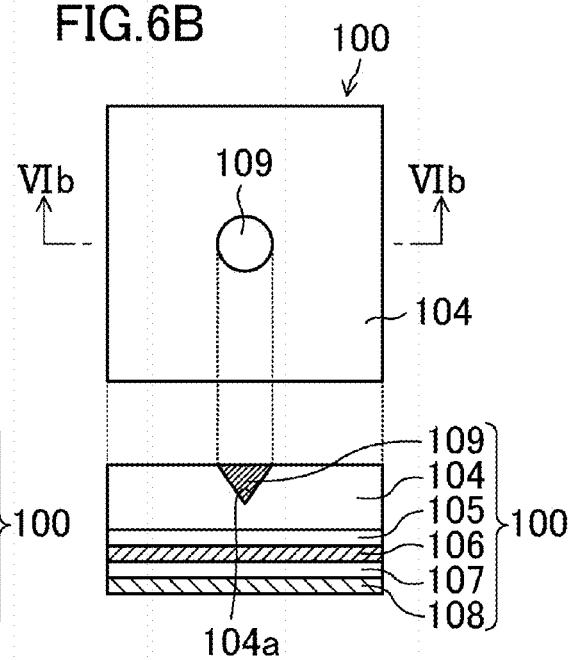
Figure 6C:
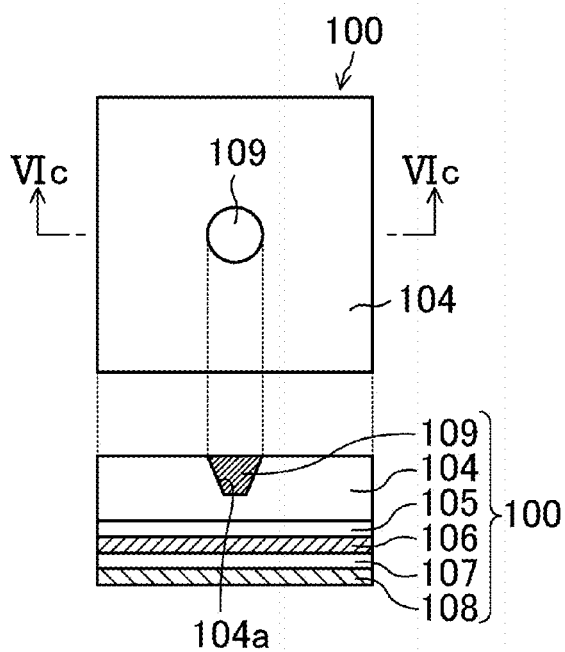

For example, FIG. 6A illustrates an example in which the n-side electrode 109 forms a rectangular shape as viewed in cross section. FIG. 6B illustrates an example in which the n-side electrode 109 forms a triangular shape as viewed in cross section. FIG. 6C illustrates an example in which the n-side electrode 109 forms a trapezoidal shape as viewed in cross section.

Next, FIGS. 7A-7D illustrate variations of the conditions where the n-side electrode 109 is formed in the recess 104a formed in the conductive substrate 104.

For example, FIG. 7A illustrates an example in which the n-side electrode 109 is formed only in a lower part of the recess 104a. FIG. 7B illustrates an example in which the sheet-like n-side electrode 109 is formed on the inner surface of the recess 104a. FIG. 7C illustrates an example in which the n-side electrode 109 has the configuration illustrated in FIG. 7B, and in addition, an electrode 119 is provided on the conductive substrate 104 so as to be connected to the n-side electrode 109.

FIG. 7D illustrates an example in which the n-side electrode 109 has the configuration illustrated in FIG. 7B, and in addition, a minute uneven structure is formed on the inner surface of the recess 104a. In a region of the minute uneven structure being in contact with the n-side electrode 109, the contact area between the inner surface of the recess 104a and the n-side electrode 109 increases, thereby reducing the contact resistance. In a region of the minute uneven structure exposed without being in contact with the n-side electrode 109, the light extraction efficiency can be improved. The surface roughness Ra of the minute uneven structure may be not less than $\lambda/30$ and not more than $\lambda \times 5$. The surface roughness Ra of the minute uneven structure may be not less than $\lambda/30$ and not more than $\lambda \times 3$. The surface roughness Ra of the minute uneven structure may be not less than $\lambda/2$ and not more than $\lambda \times 3$. Here, $\lambda$ represents the wavelength of light from the active layer 106. When the surface roughness Ra is not less than λ/30 and not more than λ×3, light passing through the minute uneven structure undergoes scattering called Rayleigh scattering or Mie scattering. When the surface roughness is not less than λ/2, diffuse components increase. Specifically, when the wavelength of polarized light generated by the active layer 106 is 450 nm, the surface roughness Ra may be not less than 15 nm and not more than 2.25 µm. The surface roughness Ra may be not less than 15 nm and not more than 1.35 µm. The surface roughness Ra may be not less than 225 nm and not more than 1.35 µm. However, the surface roughness Ra needs to be less than the depth D1 of the recess 104a.

As such, none of the n-side electrodes 109 according to the variations illustrated in FIGS. 7A-7D fills the recess 104a.

The cross-sectional shape of the recess 104a is preferably such that the diameter of the recess 104a increases with increasing distance from the active layer 106. This facilitates forming the n-side electrode 109.

(Variations of Placement of N-Side Electrodes)

FIGS. 8A-8C illustrate variations of the placement of n-side electrodes 109 included in the nitride semiconductor light emitting chip according to the first embodiment. FIGS. 8A-8C each illustrate only the nitride semiconductor light emitting chip 100. FIGS. 3A-4B each illustrate an example in which only the single n-side electrode 109 is formed. However, a plurality of n-side electrodes 109 may be provided. Furthermore, the plurality of n-side electrodes 109 may be connected together through an electrode 119.

For example, FIG. 8A illustrates an example in which four n-side electrodes 109 are formed on a conductive substrate 104. FIG. 8B illustrates an example in which two n-side electrodes 109 are formed, and the two n-side electrodes 109 extend in a specific direction, are arranged in parallel, and are elliptical when viewed in plan. Here, the angle between the direction of extension of each of the n-side electrodes 109 and the direction of polarization of light from an active layer 106 may be 25-90°.

FIG. 8C illustrates an example in which four n-side electrodes 109 are formed, and the four adjacent n-side electrodes 109 are connected together through an electrode 119. In this case, a wire 110 may be connected to the n-side electrodes 109. Alternatively, similar to the example illustrated in FIGS. 4A and 4B, the wire 110 may be formed on a portion of the electrode 119 located on a thick region of a conductive substrate 104.

Even when the contact area between the single n-side electrode 109 and the conductive substrate 104 is equal to that between the plurality of n-side electrodes 109 and the conductive substrate 104, i.e., even when the contact resistance between the single n-side electrode 109 and the conductive substrate 104 is equal to that between the plurality of n-side electrodes 109 and the conductive substrate 104, forming the plurality of n-side electrodes 109 as described above can further reduce the concentration of current flowing through the conductive substrate 104. This can reduce the operating voltage of the nitride semiconductor light emitting chip 100.

Hereinafter, it is assumed that as described below, the conductive substrate 104 has sides each having a length of, e.g., 300 µm, and a plurality of n-side electrodes 109 are formed on the back surface of the conductive substrate 104. In this case, when the n-side electrodes 109 are placed one per an area of 22500 µm² of the back surface of the conductive substrate 104, the substrate resistance can be reduced to about one half of the substrate resistance when the n-side electrodes 109 are placed one per 90000 µm², i.e., entire area of the back surface of the conductive substrate 104. Furthermore, when the n-side electrodes 109 are placed one per an area of 10000 µm² of the back surface of the substrate 104, the substrate resistance can be reduced to about two fifth of the substrate resistance when the n-side electrodes 109 are placed one per 90000 µm², i.e., the entire area of the back surface of the substrate 104.

As described below, the sum of the contact areas between the inner surfaces of recesses 104a formed in the conductive substrate 104 and the n-side electrodes 109 may be not less than 5% of the area of the back surface of the conductive substrate 104. This can reduce the influence of the contact resistance between each of the recesses 104a and a corresponding one of the n-side electrodes 109. The sum of the contact areas between the inner surfaces of the recesses 104a and the n-side electrodes 109 may be not more than 18% of the area of the back surface of the conductive substrate 104. This can reduce, to about 10% or less, the light output decrease arising from the n-side electrodes 109 blocking light emitted from the active layer 106.

As described below, the total area of regions of the conductive substrate 104 in which the recesses 104a are formed when viewed in plan may be not more than 30% of the area of the back surface of the conductive substrate 104. Thus, the mechanical strength of the conductive substrate 104 is maintained, thereby reducing breaks in the substrate during handling.

The recesses 104a formed in the conductive substrate 104 are preferably prevented from reaching opposed side surfaces of the conductive substrate 104 and passing through both the side surfaces. The reason for this is that when the recesses 104a formed in the conductive substrate 104 pass through both the opposed side surfaces of the conductive substrate 104, the conductive substrate 104 (the nitride semiconductor light emitting chip 100) may be divided at unintended locations in a step of singulating the substrate into chips.

(Fabrication Method)

A method for fabricating a nitride semiconductor light emitting device according to the first embodiment will be described hereinafter with reference to FIGS. 3A and 3B.

First, an n-type nitride semiconductor layer 105 is epitaxially grown on the principal surface of a conductive substrate 104 having an m-plane as its principal surface and made of n-type GaN by metal organic chemical vapor deposition (MOCVD) or any other method. Specifically, for example, silicon (Si) is used as an n-type dopant, trimethylgallium (TMG ($Ga(CH_3)_3$)) being a gallium source, and ammonia ($NH_3$) being a nitrogen source are supplied to the substrate 104, and the about 1-3-µm-thick n-type nitride semiconductor layer 105 made of GaN is formed at a growth temperature of 900-1100° C. In this stage, the conductive substrate 104 is a substrate at the wafer level, and a plurality of light emitting structures forming nitride semiconductor light emitting devices can be fabricated at once.

Next, an active layer 106 made of a nitride semiconductor is grown on the n-type nitride semiconductor layer 105. The active layer 106 has an InGaN/GaN multiple quantum well (MQW) structure in which, for example, 3-15-nm-thick well layers made of $In_{1-x}Ga_xN$ and 10-30-nm-thick barrier layers made of GaN are alternately stacked. When the well layers made of $In_{1-x}Ga_xN$ are formed, the growth temperature may be decreased to about 700-800° C. to ensure incorporation of In into the well layers being grown. The wavelength of emitted light is selected based on the intended use of the nitride semiconductor light emitting device, and the In content x is determined based on the wavelength. For example, when the wavelength is 450 nm (blue light wavelength), the In content x is determined to be 0.25-0.27. When the wavelength is 520 nm (green light wavelength), the In content x is determined to be 0.40-0.42. When the wavelength is 630 nm (red light wavelength), the In content x is determined to be 0.56-0.58.

Next, a p-type nitride semiconductor layer 107 is epitaxially grown on the active layer 106. Specifically, for example, bis(cyclopentadienyl) magnesium ($Cp_2Mg$) is used as p-type impurities, TMG and $NH_3$ are supplied, as materials, to the substrate 104, and the about 50-500-nm-thick p-type nitride semiconductor layer 107 made of p-type GaN is formed on the active layer 106 at a growth temperature of 900-1100° C. The p-type nitride semiconductor layer 107 may contain an about 15-30-nm-thick p-type AlGaN layer. The formation of the p-type AlGaN layer can reduce the overflow of electrons that are carriers. An undoped GaN layer may be formed between the active layer 106 and the p-type nitride semiconductor layer 107.

Next, in order to activate Mg with which the p-type nitride semiconductor layer 107 is doped, the p-type nitride semiconductor layer 107 is thermally treated at a temperature of about 800-900° C. for about 20 minutes.

Next, a p-side electrode 108 is selectively formed on and in contact with the p-type nitride semiconductor layer 107. For example, a multilayer film (Pd/Pt layer) of palladium (Pd) and platinum (Pt) is formed, as the p-side electrode 108, by sputtering or any other process. Thereafter, heat treatment is performed to alloy an interface region between the Pd/Pt layer and the p-type nitride semiconductor layer 107. Gold (Au), silver (Ag), aluminum (Al), copper (Cu), or gold tin (AuSn) may be formed on a surface of the p-side electrode 108.

Next, a (back) surface of the conductive substrate 104 further from the p-side electrode 108 is polished to reduce the thickness T of the conductive substrate 104 to about 50-200 μm.

Next, at least one recess 104a having a desired shape is formed in the back surface of the conductive substrate 104 that has been reduced in thickness. In order to form the recess 104a, a resist is patterned by, e.g., a method using a contact exposure system, a method using an electron beam lithography system, or a method using a stepper. Thereafter, the recess 104a is formed in the conductive substrate 104 by dry etching using the resist pattern as a mask. The size of the recess 104a in plan view, the number of the at least one recess 104a, and the location of the at least one recess 104a (layout) can be controlled using an exposure mask for patterning. The depth D1 of the recess 104a can be determined by the etching conditions and the etching time.

For example, grinding using a dicing blade, or thermal melting using high-density laser light can be used to form the recess 104a. In such a method, minute projections/recesses can be formed on the inner surface of the recess 104a. Furthermore, a patterning step is not required, and the fabrication process can be simplified. For example, in the case of grinding using a dicing blade, when a straight blade is used, a recess 104a having a square cross-sectional shape can be obtained. Alternatively, when a blade having an inclined side surface is used, a recess 104a having a V-shaped cross-sectional shape or a trapezoidal cross-sectional shape can be formed. The size or width of the recess 104a depends on the thickness of the blade. The number and location of the at least one recess 104a can be determined by the manner in which the blade is operated. The depth D1 of the recess 104a depends on the surface to be ground and the location at which the blade is set. Such grinding using a dicing blade enables the formation of a minute uneven structure having a peak-to-valley distance of about 100 nm through 1 μm on the inner surface of the recess 104a. For example, in the case of thermal melting using high-density laser light, at least one recess 104a is formed at a location that has been scanned with laser light. The size of the at least one recess 104a in plan view, and the number and location of the at least one recess 104a can be optionally determined by a laser scanning method. Similarly, the cross-sectional shape of the recess 104a can be also determined. For example, in order to allow the cross-sectional shape of the recess 104a to be square, the scanning speed of the laser light is preferably increased, or the location of the focus of the laser light is preferably moved further from the conductive substrate 104. For example, in order to allow the cross-sectional shape of the recess 104a to be V-shaped or trapezoidal, the scanning speed of the laser light is preferably reduced, or the location of the focus of the laser light is preferably moved closer to the conductive substrate 104. Furthermore, when laser light is intensity-modulated into pulses, a minute uneven structure can be also formed on the inner surface of the recess 104a as illustrated in FIG. 7D. The surface roughness Ra of the minute uneven structure can be determined by the location of the focus of the laser light and the scanning speed thereof. For example, when the surface roughness Ra of the minute uneven structure is to be increased, the scanning speed of the laser light is preferably reduced, or the location of the focus of the laser light is preferably moved further from the conductive substrate 104. Conversely, when the surface roughness Ra is to be reduced, the scanning speed of the laser light is preferably increased, or the location of the focus of the laser light is preferably moved closer to the conductive substrate 104. Specifically, when the scanning speed of the laser light is within the range from 50 mm/s to 300 mm/s, the angle between the direction of the normal line to the principal surface and the inner surface (side surface) of the recess 104a can be controlled within the range from 15° to 75°. Furthermore, when the scanning speed of the laser light is within, e.g., the range from 50 mm/s to 300 mm/s, the surface roughness Ra of the minute uneven structure can be controlled within the range from about 20 nm to about 1 μm. When the recess 104a has been formed by thermal melting using high-density pulsed laser light, a residue deposited by melting is preferably removed by wet etching. For example, hydrochloric acid (HCl), nitric acid ($HNO_3$), or potassium hydroxide (KOH) can be used as a solution for use in wet etching. As such, the recess 104a is formed by grinding using a dicing blade or thermal melting using high-density laser light, thereby enabling the fabrication of the nitride semiconductor light emitting chip 100 according to the variation illustrated in FIG. 7D.

Next, an n-side electrode 109 is formed in contact with the inner surface of the recess 104a. Here, for example, a multilayer film (Ti/Pt layer) of Ti and Pt is formed as the n-side electrode 109. Furthermore, Au, Ag, Al, Cu, or AuSn may be formed on a region of the surface of the n-side electrode 109 connected to the wire 110. Thereafter, heat treatment is performed to alloy an interface region between the n-side electrode 109 and the conductive substrate 104.

Next, separation grooves are formed in the back or front surface of the substrate 104 using a laser melting apparatus or a diamond scriber, and then, the substrate 104 is divided into small pieces using a breaking device. The depth of each of the separation grooves can be larger than the depth D1 of the recess 104a. The reason for this is that when the depth of the separation groove is smaller than the depth D1, the substrate 104 may be divided at unintended locations. As such, nitride semiconductor light emitting chips 100 are completed.

Next, the individual semiconductor light emitting chips 100 into which the substrate 104 has been singulated are each fixed and mounted on a mounting surface of a mounting substrate 101.

First, the mounting substrate 101 is prepared. As described above, an insulative material, such as alumina, AlN, or a glass epoxy resin, a metal material containing, e.g., Al, Cu, or W, a semiconductor material, such as Si or Ge, or a composite of the materials can be used as the principal material of the mounting substrate 101. A metal, such as Al, Ag, Au, or Cu, can be used as a material forming the interconnect electrode layers 102. A metal film for forming interconnect electrode layers is formed on the surface of the mounting substrate 101 through a film formation process, such as sputtering or plating. Subsequently, a desired resist pattern is formed on the formed metal film by, e.g., lithography. Thereafter, the resist pattern is transferred to the metal film by dry etching or wet etching to form interconnect electrode layers 102 each having a desired electrode shape. Solder made of AuSn may be formed on the surfaces of the interconnect electrode layers 102.

One of the interconnect electrode layers 102 on the mounting substrate 101 prepared as described above and the p-side electrode 108 of the nitride semiconductor light emitting chip 100 are connected together while facing each other. Thus, junction-down mounting is performed. For example, alloyed junction using solder, ultrasonic bonding, or connection using conductive paste material containing, e.g., Ag can be used as a process for connecting the interconnect electrode layer 102 with the p-side electrode 108.

Next, the n-side electrode 109 and the other one of the interconnect electrode layers 102 are connected together using a wire bonding device. For example, Au, Al, or Cu can be used as the material of the wire 110.

Next, a light-transmissive member 111 is formed on the mounting substrate 101 by, e.g., coating, to cover the nitride semiconductor light emitting chip 100, the wire 110, and the interconnect electrode layers 102. An acrylic resin or a silicone resin can be used as a material of the light-transmissive member 111.

Through the above-described process steps, the nitride semiconductor light emitting device according to the first embodiment can be obtained.

As such, in the nitride semiconductor light emitting device according to the first embodiment, while the mechanical strength of the conductive substrate 104 is maintained, the substrate resistance is reduced to an adequate level. As a result, while high light extraction efficiency is provided, the luminous efficiency can be improved.

Second Embodiment

A nitride semiconductor light emitting device according to a second embodiment will be described hereinafter with reference to FIGS. 9A and 9B. Here, the difference between the first and second embodiments will be described.

Figure 9A:
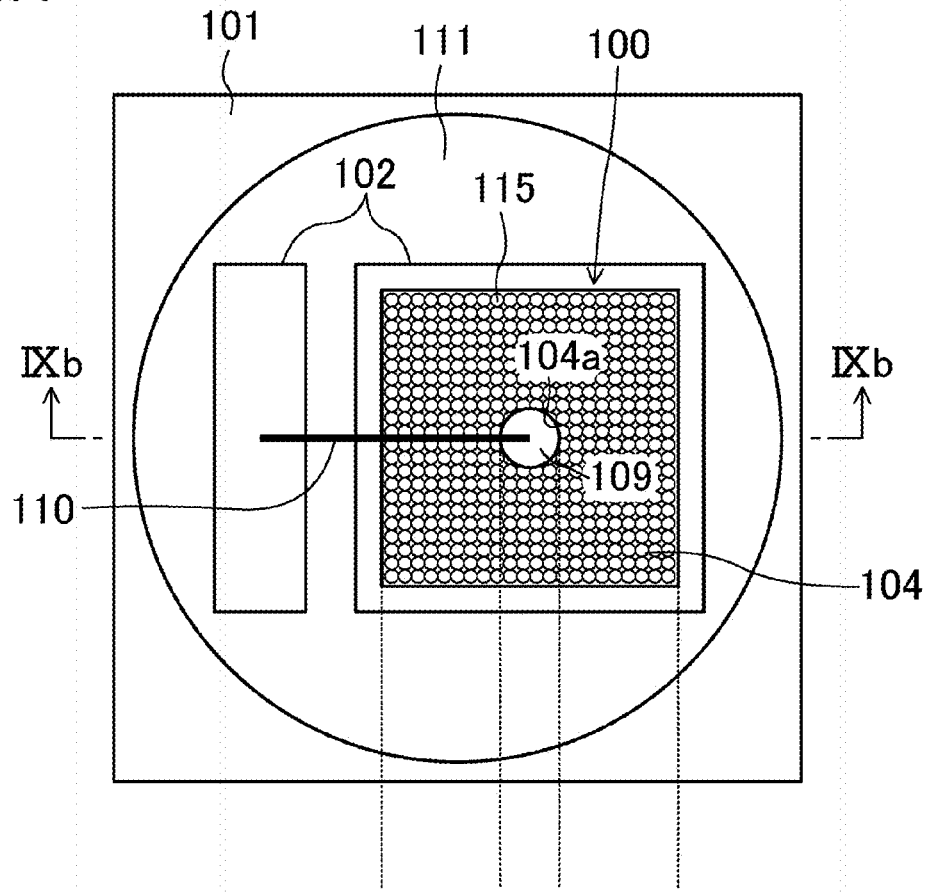
FIG. 9A is a schematic plan view illustrating a nitride semiconductor light emitting device according to a second embodiment.

FIG. 9A schematically illustrates a plan configuration of a nitride semiconductor light emitting device according to the second embodiment. FIG. 9B schematically illustrates a cross-sectional configuration taken along the line IXb-IXb in FIG. 9A.

Figure 9B:
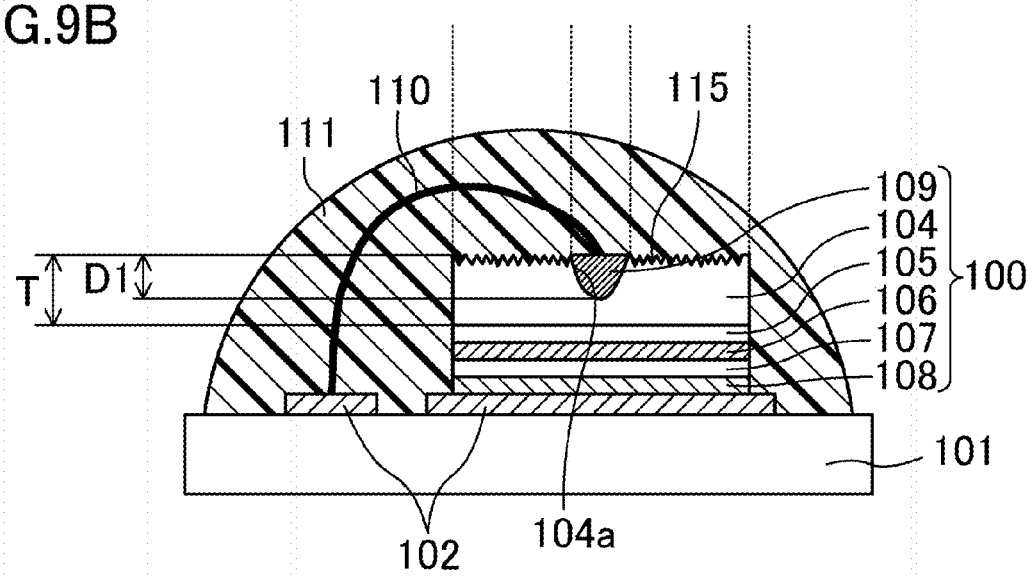
FIG. 9B is a schematic cross-sectional view taken along the line IXb-IXb in FIG. 9A.

As illustrated in FIGS. 9A and 9B, the nitride semiconductor light emitting device according to the second embodiment includes a mounting substrate 101, interconnect electrode layers 102 selectively formed on the mounting substrate 101, a nitride semiconductor light emitting chip 100 fixed and mounted on one of the interconnect electrode layers 102 on the mounting substrate 101, a wire 110 connecting the nitride semiconductor light emitting chip 100 and the other one of the interconnect electrode layers 102, and a light-transmissive member 111 covering the interconnect electrode layers 102, the wire 110, and the nitride semiconductor light emitting chip 100.

Unlike the first embodiment, in the nitride semiconductor light emitting device according to the second embodiment, an uneven structure 115 is formed on the back surface (light extraction surface) of a conductive substrate 104 forming a portion of the nitride semiconductor light emitting chip 100. The uneven structure 115 formed on the light extraction surface of the conductive substrate 104 allows polarized light emitted from an active layer 106 to be easily extracted. Thus, the light output is improved. The cross-sectional shape of each of raised/recessed portions of the uneven structure 115 is not limited to the triangular shape illustrated in FIG. 9B, and may be any one of various shapes, such as a trapezoidal shape or a semicircular shape. The surface of each of the raised/recessed portions of the uneven structure 115 may be curved. Furthermore, as illustrated in FIG. 9A, the raised/recessed portions of the uneven structure 115 are arranged in a matrix when viewed in plan. However, the raised/recessed portions of the uneven structure 115 do not always need to be arranged in lines, and may be placed at optional locations.

(Variations of Uneven Structure and N-Side Electrode Formed on Conductive Substrate)

Figure 10A:
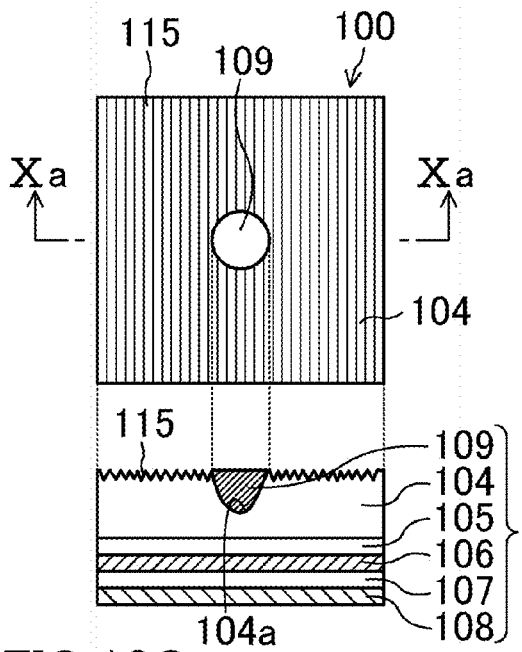
FIGS. 10A-10C are schematic plan views and cross-sectional views illustrating variations of a nitride semiconductor light emitting chip according to the second embodiment.
Figure 10B:
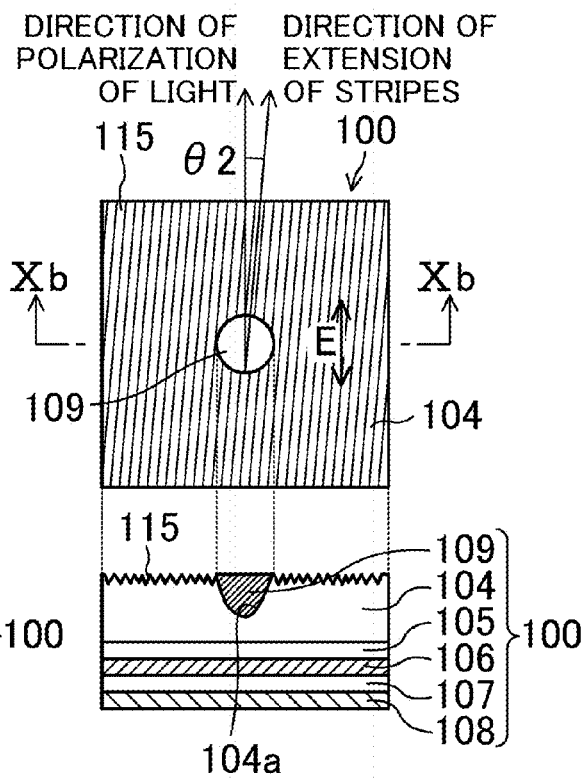
Figure 10C:
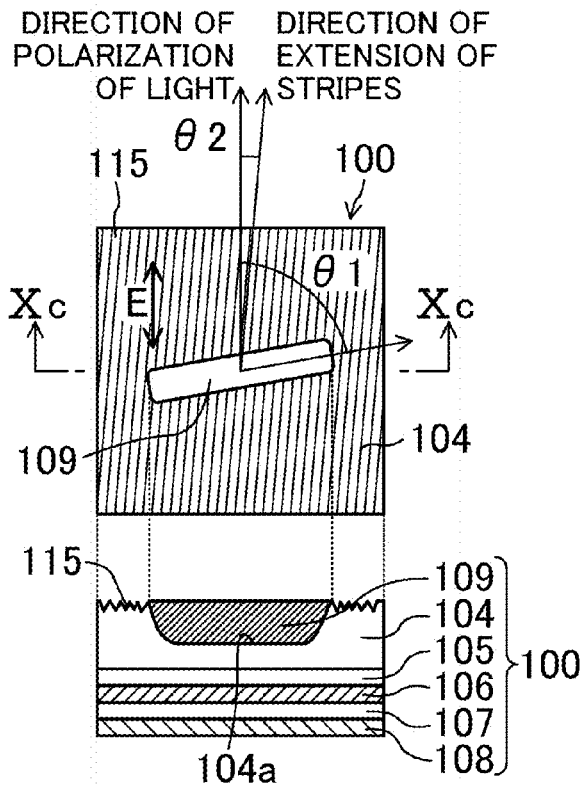

FIGS. 10A-10C illustrate variations of the nitride semiconductor light emitting chip of the second embodiment. FIGS. 10A-10C each illustrate only the nitride semiconductor light emitting chip 100. In the first variation illustrated in FIG. 10A, an uneven structure 115 is formed on the back surface of the conductive substrate 104 in a striped pattern when viewed in plan. The cross-sectional shape of each of stripes is not limited to the triangular shape illustrated in FIG. 10A, and may be any one of various shapes, such as a trapezoidal shape or a semicircular shape. The surface of each of the stripes may be curved.

An uneven structure 115 according to the second variation illustrated in FIG. 10B is formed such that an angle θ2 is formed between the direction of extension of the stripes and the direction of polarization of light from the active layer 106. The angle θ2 may be 0-45°. The angle θ2 may be 0-25°. The angle θ2 may be substantially 0°. As long as the angle θ2 is within the above range, the light extraction efficiency can be improved. Furthermore, when the angle θ2 is within the range of 0-3°, the degree of polarization of emitted light is maintained. When the angle θ2 is within the range of 5-85°, the degree of polarization of emitted light can be reduced.

In the third variation illustrated in FIG. 10C, an angle θ2 is formed between the direction of extension of stripes of the striped uneven structures 115 and the direction of polarization of light, and in addition to this feature, an n-side electrode 109 forms a rectangular (elliptical) shape extending in a specific direction when viewed in plan. The specific direction in which the n-side electrode 109 extends forms an angle θ1 relative to the direction of polarization of light from an active layer 106. Here, the angle θ1 may be 25-90°. The angle θ1 may be 45-90°. The angle θ1 may be substantially 90°. As long as the angle θ1 is within the above range, this can reduce the light output decrease arising from the n-side electrode 109 blocking the light emitted from the active layer 106. Similarly to the second variation, the angle θ2 may be 0-45°. The angle θ2 may be 0-25°. The angle θ2 may be substantially 0°. As long as the angle θ2 is within the above range, the light extraction efficiency can be improved. Furthermore, when the angle θ2 is within the range of 0-3°, the degree of polarization of emitted light is maintained. When the angle θ2 is within the range of 5-85°, the degree of polarization of emitted light can be reduced.

The peak-to-valley distance or peak-to-peak distance of the uneven structure 115 formed on the light extraction surface of the conductive substrate 104 may be not less than λ/30 and not more than λ×5. It may be not less than λ/30 and not more than λ×3. It may be not less than λ/2 and not more than λ×3. Here, the character λ represents the wavelength of light from the active layer 106. Specifically, when the wavelength of polarized light generated by the active layer 106 is 450 nm, the peak-to-valley distance or peak-to-peak distance of the uneven structure 115 may be not less than 15 nm and not more than 2.25 μm. It may be not less than 15 nm and not more than 1.35 μm. It may be not less than 225 nm and not more than 1.35 μm. However, the peak-to-valley distance of the uneven structure 115 needs to be less than the depth D1 of a recess 104a.

Also when such an uneven structure 115 as illustrated in each of FIGS. 9A-10C is formed, a wire 110 may be formed on the n-side electrode 109. Alternatively, similarly to the example illustrated in FIGS. 4A and 4B, an extraction electrode may be provided on the uneven structure 115, and a wire 110 may be formed on the extraction electrode.

(Fabrication Method)

Here, the difference between the fabrication method for the nitride semiconductor light emitting device according to the first embodiment and a fabrication method for the nitride semiconductor light emitting device according to the second embodiment will be described.

Unlike the first embodiment, the fabrication method according to the second embodiment includes a step of forming an uneven structure 115 on the back surface of a conductive substrate 104. The uneven structure 115 is preferably formed after the back surface of the conductive substrate 104 has been polished to reduce the thickness of the conductive substrate 104 and before a recess 104a is formed.

A nonpolar or semipolar plane of a GaN substrate is difficult to be processed by wet etching. For this reason, in order to form an uneven structure 115, a resist is firstly patterned using, e.g., a contact exposure system, an electron beam lithography system, or a stepper. Thereafter, an uneven structure 115 is formed on the conductive substrate 104 by dry etching using the resist pattern as a mask. Process steps except the step of forming the uneven structure 115 can be performed by the method described in the first embodiment.

As described above, the nitride semiconductor light emitting device according to the second embodiment provides high light extraction efficiency, and simultaneously, the substrate resistance is reduced to an adequate level, thereby improving luminous efficiency.

Third Embodiment

A nitride semiconductor light emitting device according to a third embodiment will be described hereinafter with reference to FIGS. 11A and 11B. Here, the difference between the first embodiment and the third embodiment will be described.

Figure 11A:
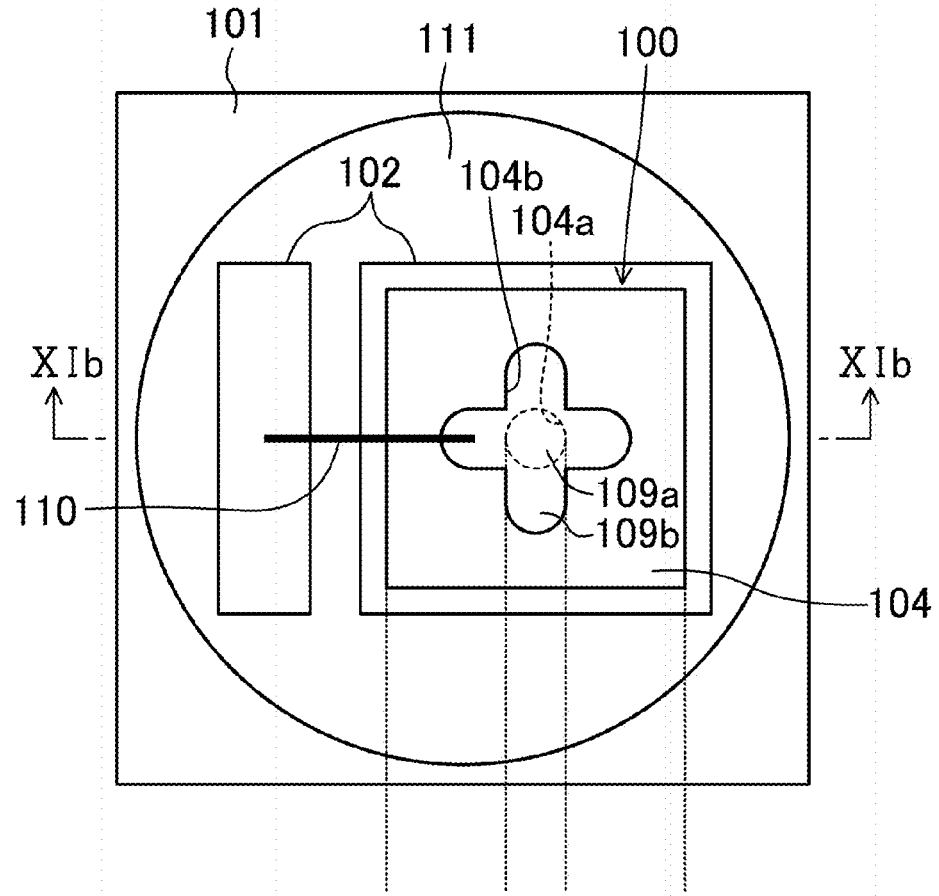
FIG. 11A is a schematic plan view illustrating a nitride semiconductor light emitting device according to a third embodiment.

FIG. 11A schematically illustrates a plan configuration of a nitride semiconductor light emitting device according to the third embodiment. FIG. 11B schematically illustrates a cross-sectional configuration taken along the line XIb-XIb in FIG. 11A.

Figure 11B:
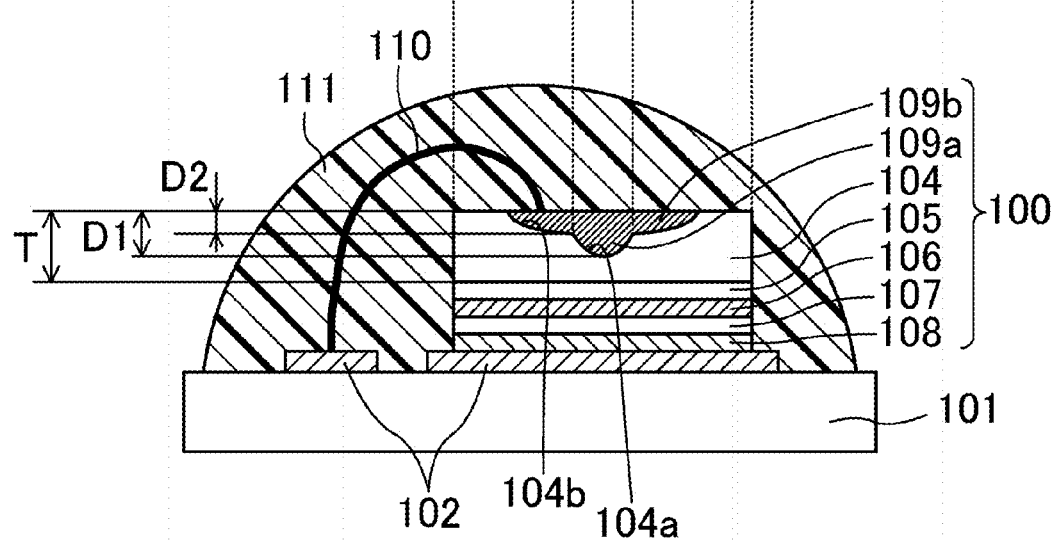
FIG. 11B is a schematic cross-sectional view taken along the line XIb-XIb in FIG. 11A.

As illustrated in FIGS. 11A and 11B, the nitride semiconductor light emitting device according to the third embodiment includes a mounting substrate 101, interconnect electrode layers 102 selectively formed on the mounting substrate 101, a nitride semiconductor light emitting chip 100 fixed and mounted on one of the interconnect electrode layers 102 on the mounting substrate 101, a wire 110 connecting the nitride semiconductor light emitting chip 100 and the other one of the interconnect electrode layers 102, and a light-transmissive member 111 covering the interconnect electrode layers 102, the wire 110, and the nitride semiconductor light emitting chip 100.

Unlike the first embodiment, in the nitride semiconductor light emitting device according to the third embodiment, a recess 104a that has a depth D1 and is circular when viewed in plan, and two grooves 104b each having a depth D2 shallower than the depth D1, each having a width equal to the width of the recess 104a, and crossing each other on the recess 104a when viewed in plan are formed in the back surface of a conductive substrate 104 of the nitride semiconductor light emitting chip 100.

A first n-side electrode 109a is formed in the recess 104a to be in contact with the inner surface of the recess 104a. Second n-side electrodes 109b are formed in the grooves 104b to be in contact with the inner surfaces of the grooves 104b. Here, the depth D1 represents the distance from the back surface of the conductive substrate 104 to the bottom of the recess 104a, and the depth D2 represents the distance from the back surface of the conductive substrate 104 to the bottom of each of the grooves 104b.

The depth D1 of the recess 104a is not less than two fifth of the thickness T, where T represents the thickness of the conductive substrate 104 as illustrated in FIG. 11B. When the depth D1 is not less than two fifth of the thickness T, the substrate resistance can be 10% lower than when no recess 104a is formed. Furthermore, when the depth D1 is not less than three fifth of the thickness T, the substrate resistance can be 20% lower than when no recess 104a is formed. Furthermore, when the depth D1 is not less than four fifth of the thickness T, the substrate resistance can be 50% lower than when no recess 104a is formed. As such, the first n-side electrode 109a formed in the recess 104a functions to reduce the substrate resistance.

Typically, when the inner surface of a deep recess having a depth that is greater than or equal to two fifth of the thickness of a substrate (recess with high aspect ratio) is coated with metal, this tends to cause defects, such as disconnection of the metal, during a process. However, when, as described in this embodiment, a recess has a two-step structure including a recess 104a, and grooves 104b shallower than the recess 104a, this can reduce the aspect ratio of the recess to about one half of the aspect ratio of the recess that does not have the two-step structure. As a result, defects, such as disconnection of metal, during a process can be reduced.

Here, the depth D2 of each of the grooves 104b may be about one half of the depth D1 of the recess 104a. In this case, the aspect ratio of the recess 104a is about one half of the aspect ratio of the recess that does not have the two-step structure.

(Variations of N-Side Electrodes)

FIGS. 12A-12D illustrate variations of the planar and cross-sectional shapes of the nitride semiconductor light emitting chip according to the third embodiment. FIGS. 12A-12D each illustrate only the nitride semiconductor light emitting chip 100.

In the first variation illustrated in FIG. 12A, four grooves 104b each having a depth D2 have four points of intersection when viewed in plan. Four recesses 104a each having a depth D1 are formed at the four points of intersection. N-side electrodes 109a and 109b formed in the recesses 104a and the grooves 104b, respectively, can reduce the concentration of current, thereby further reducing the substrate resistance.

In the second variation illustrated in FIG. 12B, recesses 104a and grooves 104b have configurations similar to the configurations of those according to the first variation illustrated in FIG. 12A, and second n-side electrodes 109b are formed in parts of the grooves 104b without filling the grooves 104b. In other words, the four second n-side electrodes 109b are formed to the extent that first n-side electrodes 109a formed in the four recesses 104a are electrically connected together. What significantly contributes to a reduction in the substrate resistance is the first n-side electrode 109a formed in each of the recesses 104a. Therefore, the light extraction efficiency can be improved by reducing the area in which each of the second n-side electrodes 109b is formed.

In the third variation illustrated in FIG. 12C, in addition to the configuration according to the second variation illustrated in FIG. 12B, a striped uneven structure 115 is formed on a region of the back surface of the conductive substrate 104 except a region thereof in which grooves 104b are formed. As described in the variation of the second embodiment, when the uneven structure 115 is provided on the back surface of the conductive substrate 104, this improves the light extraction efficiency.

In the fourth variation illustrated in FIG. 12D, in addition to the configuration according to the second variation illustrated in FIG. 12B, a minute uneven structure is formed on the inner surfaces of recesses 104a and the inner surfaces of grooves 104b. As described in the variation of the first embodiment, in a region of the minute uneven structure being in contact with the n-side electrodes 109a and 109b, the contact area between the region and the n-side electrodes 109a and 109b increases. Thus, the contact resistance is reduced. In an exposed region of the minute uneven structure, the light extraction efficiency can be improved.

In each of the examples illustrated in FIGS. 11A-12D, a wire 110 may be formed on one of the first n-side electrodes 109a being in contact with the inner surfaces of the recesses 104a, or may be formed on one of the second n-side electrodes 109b being in contact with the inner surfaces of the grooves 104b. Alternatively, similar to the example illustrated in FIGS. 4A and 4B, an electrode 119 may be routed to a thick region of a conductive substrate 104, and a wire 110 may be formed on the electrode 119.

In each of the examples illustrated in FIGS. 11A-12D, the situation where the grooves 104b have equal widths and equal depths was described. However, the grooves 104b may have different widths and different depths. When two of the grooves 104b crossing each other have different widths, one of the recesses 104a located at the point of intersection of the two grooves 104b is elliptical when viewed in plan. When the two grooves 104b crossing each other have different depths, the recess 104a located at the point of intersection of the two grooves 104b may have a depth corresponding to the sum of the depths of the two grooves 104b.

(Fabrication Method)

Here, the difference between the fabrication method for the nitride semiconductor light emitting device according to the first embodiment and a fabrication method for the nitride semiconductor light emitting device according to the third embodiment will be described.

Unlike the first embodiment, the fabrication method according to the third embodiment includes a step of forming a recess 104a having a depth D1, and grooves 104b each having a depth D2 different from the depth D1. In order to form the recess 104a, dry etching, grinding using a dicing blade, thermal melting using high-density laser light, or any other method can be used alone or in combination. In particular, when thermal melting using high-density laser light is used, the recess 104a and the grooves 104b each having a depth different from the depth of the recess 104a can be formed in a single process step. Specifically, when thermal melting using high-density laser light is used, and the back surface of the conductive substrate 104 is scanned with laser beams such that the point of intersection of the laser beams is formed, a part of the conductive substrate 104 at the point of intersection of the laser beams is molten twice by the laser beams, and thus, the recess 104a having a depth that is about twice as large as the depth of each of the surrounding grooves 104b can be formed.

As described above, the nitride semiconductor light emitting device according to the third embodiment prevents the problem of breaks in the n-side electrodes 109a and 109b during the formation of the electrodes 109a and 109b, and simultaneously, the substrate resistance is reduced to an adequate level. As a result, while high light extraction efficiency is provided, the luminous efficiency can be improved.

EXAMPLES

Prior to examples, (1) the influence of the area ratio of an n-side electrode to the chip size on the light output, (2) the influence of the area ratio of the n-side electrode to the chip size on the substrate resistance, (3) the influence of the depth D1 of a recess on the substrate resistance, (4) the influence of the placement of n-side electrodes on the substrate resistance, (5) the influence of the direction of extension of an uneven structure formed on a light extraction surface upon polarization characteristics, and (6) the influence of thermal melting using high-density laser light on the shape of the (inner) surface of a recess, which were described in the embodiments, will be quantitatively described hereinafter.

(1) Influence of Area Ratio of N-Side Electrode to Chip Size on Light Output

Figure 13A:
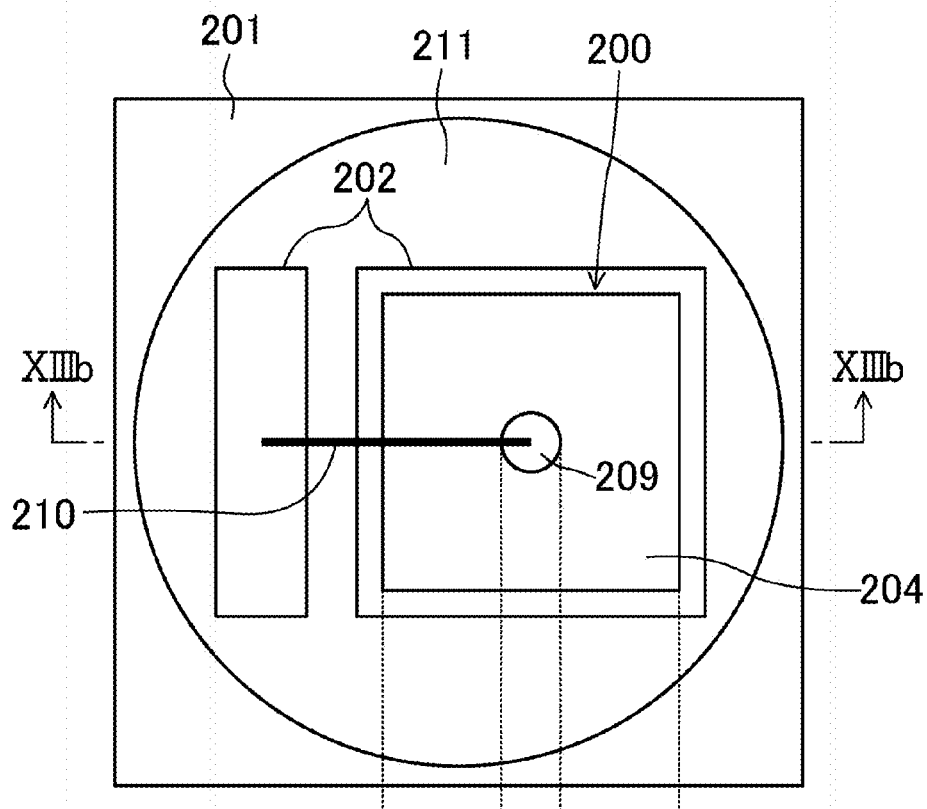
FIG. 13A is a schematic plan view illustrating a nitride semiconductor light emitting device for reference.
Figure 13B:
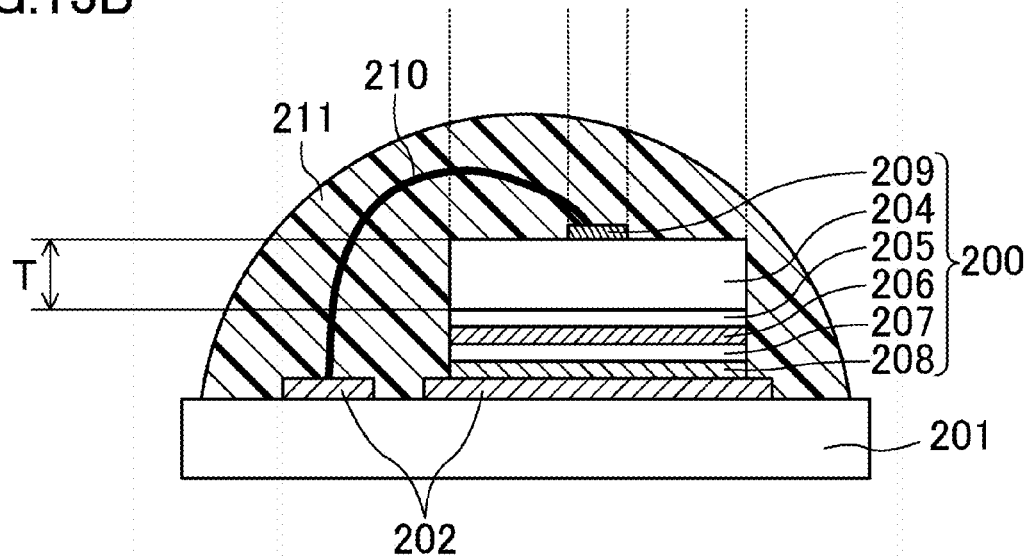
FIG. 13B is a schematic cross-sectional view taken along the line XIIIb-XIIIb in FIG. 13A.

FIGS. 13A and 13B illustrate a nitride semiconductor light emitting device for reference, and a recess 104a is not formed in the back surface, which corresponds to a light extraction surface, of a conductive substrate 104 of the nitride semiconductor light emitting device.

First, a method for fabricating the nitride semiconductor light emitting device for reference will be schematically described.

An about 2-μm-thick n-type nitride semiconductor layer 205 made of n-type GaN, an active layer 206 having a three-period quantum well structure including a quantum well layer made of InGaN and a barrier layer made of GaN, and a 0.5-μm-thick p-type nitride semiconductor layer 207 made of p-type GaN were sequentially formed on the principal surface of a wafer-level n-type GaN substrate 204 having an m-plane as the principal surface, for example, by metal organic chemical vapor deposition (MOCVD).

An Ag layer was formed as a p-side electrode 208, and an Au electrode was further formed on the Ag layer. Thereafter, the thickness of the n-type GaN substrate 204 was reduced to a thickness of 100 μm by grinding the back surface of the n-type GaN substrate 204.

Next, a Ti/Al layer was formed, as an n-side electrode 209, on the back surface of the n-type GaN substrate 204. Subsequently, an Au electrode was formed on the Ti/Al layer. Here, a plurality of n-side electrodes 209 having different areas were formed. Thus, a plurality of samples were obtained.

Next, separation grooves having a depth of about several tens of μm from the surface of the wafer on which light-emitting structures were formed were formed in the wafer along the c-axis, i.e., the [0001] direction, and the a-axis, i.e., the [11-20] direction, using laser light. Subsequently, the wafer was broken into semiconductor light emitting chips 200 which each have sides each having a length of 450 μm and are made of an m-plane GaN-based semiconductor.

Next, one of the fabricated semiconductor light emitting chips 200 was mounted on one of interconnect electrode layers 202 on a mounting substrate 201 such that the interconnect electrode layer 202 faces the p-side electrode 208. Here, the interconnect electrode layers 202 were made of Ag, and the mounting substrate 201 was made of aluminum nitride (AlN). Subsequently, the n-side electrode 209 and the other one of the interconnect electrode layers 202 were electrically connected together through a wire 210 made of Au.

Next, a light-transmissive member 211 was formed on the mounting substrate 201 to cover the nitride semiconductor light emitting chip 200, the wire 210, and the interconnect electrode layers 202.

Thus, the nitride semiconductor light emitting device for reference was fabricated.

Figure 14:
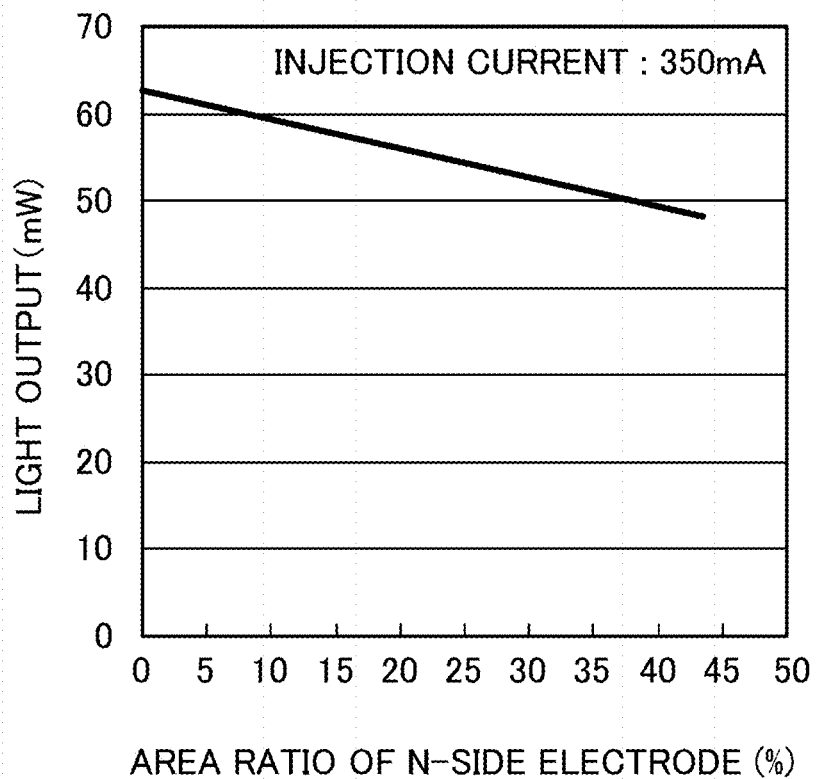
FIG. 14 is a graph illustrating the relationship between the area ratio of an n-side electrode and light output of the nitride semiconductor light emitting device for reference.

FIG. 14 illustrates the relationship between the area ratio (%) of the n-side electrode of the fabricated nitride semiconductor light emitting device for reference and the light output (mW) of the fabricated nitride semiconductor light emitting device for reference at an injection current of 350 mA. Here, the area ratio (%) of the n-side electrode denotes the ratio of the area of the n-side electrode to the area of the back surface of the substrate 204, i.e., the chip size. With increasing area ratio (%) of the n-side electrode, the light output substantially linearly decreases. This means that the surface of the nitride semiconductor light emitting chip 200 was shielded with the n-side electrode 209, and thus, extraction of light was prevented.

In view of the above result, in order to reduce the rate of reduction in the light output to 10% or less, the area ratio (%) of the n-side electrode is preferably not more than 18%.

Figure 15A:
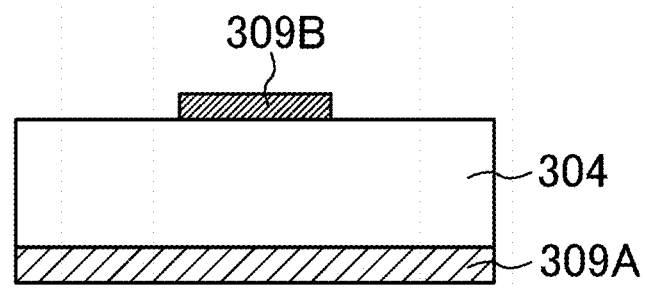
FIG. 15A is a schematic cross-sectional view illustrating a reference element for explaining the influence of the area ratio of the n-side electrode on the substrate resistance.

(2) Influence of Area Ratio of N-Side Electrode to Chip Size on Substrate Resistance FIG. 15A illustrates a schematic cross-sectional configuration of a reference element for explaining the influence of the area ratio of an n-side electrode on the substrate resistance.

As illustrated in FIG. 15A, in order to fabricate reference elements, n-type m-plane GaN substrates 304 were prepared, an n-side electrode 309A made of a Ti/Al layer was formed on one (back surface) of the surfaces of each of the n-type m-plane GaN substrates 304, and an n-side electrode layer 309B was formed on the other one (front surface) thereof. The area of the n-side electrode layer 309B was varied among the reference elements to obtain a plurality of samples. Here, each of a 320-μm-thick substrate and a 100-μm-thick substrate was prepared as the n-type m-plane GaN substrate 304. These substrates are each singulated into pieces having sides each having a length of 450 μm.

The resistance between the n-side electrode layer 309B and the n-side electrode 309A formed on the front and back surfaces, respectively, of the singulated m-plane GaN substrate 304 was measured.

When, as such, the resistance is measured using the n-type nitride semiconductor layers of the reference element that does not include a p-side electrode, a p-type nitride semiconductor layer, and an active layer, the measured resistance can be affected by only the substrate resistance and the contact resistance between each of the n-side electrodes 309A and 309B and the n-type m-plane GaN substrate 304. Therefore, a more accurate substrate resistance can be measured.

As such, the substrate resistance of an n-type conductive substrate herein denotes the resistance of an n-type nitride semiconductor layer, such as the n-type m-plane GaN substrate 304. For example, in the nitride semiconductor light emitting chip 100 illustrated in FIG. 3, the substrate resistance denotes the resistance of an n-type conductive nitride semiconductor including not only the conductive substrate 104 itself but also the n-type nitride semiconductor layer 105 grown on the conductive substrate 104.

Figure 15B:
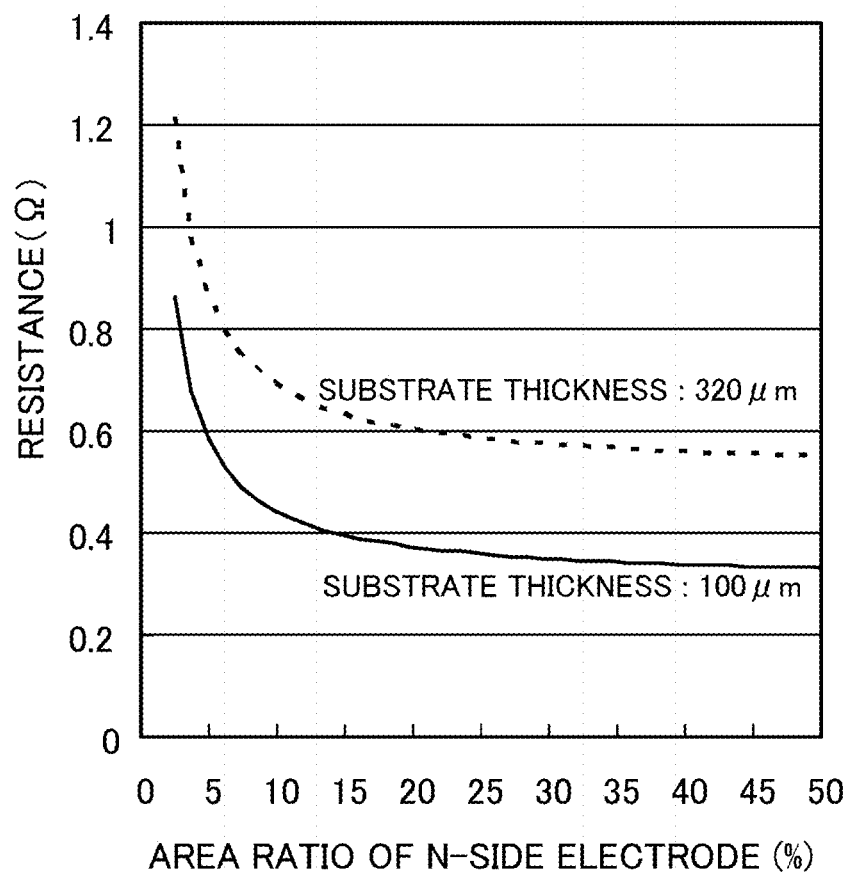
FIG. 15B is a graph illustrating the relationship between the area ratio of the n-side electrode in the reference element and the substrate resistance.

FIG. 15B illustrates the relationship between the area ratio (%) of the n-side electrode and the resistance. As described above, the area ratio (%) of the n-side electrode denotes the ratio of the area of the n-side electrode to the chip size. The measured resistance is affected by the substrate resistance and the contact resistance between each of the n-side electrodes 309A and 309B and the n-type m-plane GaN substrate 304. However, the n-side electrode 309A on the back surface of the substrate 304 has a low impact on the measured resistance, because the metal film is formed on the entire back surface thereof. Therefore, the measured resistance is significantly affected by the n-side electrode layer 309B formed on the front surface of the substrate 304 and having an area varying among the reference elements.

As seen from FIG. 15B, when the area ratio of the n-side electrode layer 309B is less than 5%, the resistance sharply increases. In contrast, when the area ratio of the n-side electrode layer 309B is not less than 10%, the resistance is stabilized. The reason for this is that the resistance is strongly affected by the contact resistance. Furthermore, when the area ratio of the n-side electrode layer 309B is greater than or equal to 20%, the resistance is substantially fixed. In this range, the resistance is determined by the substrate resistance.

When the thickness of the n-type m-plane GaN substrate 304 is 320 μm, the resistance is higher than when the thickness thereof is 100 μm. This shows that when the thickness of the n-type m-plane GaN substrate 304 is 320 μm, the substrate resistance affects the resistance.

In view of the foregoing, in order to reduce the contact resistance between the n-side electrode and the n-type m-plane GaN substrate to an adequate level, the area ratio of the n-side electrode merely needs to be not less than 5%. The area ratio of the n-side electrode may be not less than 10%.

When the substrate thickness is 320 μm, the substrate resistance estimated from FIG. 15B is 0.50Ω, and when the substrate thickness is 100 μm, the estimated substrate resistance is 0.29Ω.

(3) Influence of Depth D1 of Recess on Substrate Resistance

Figure 16:
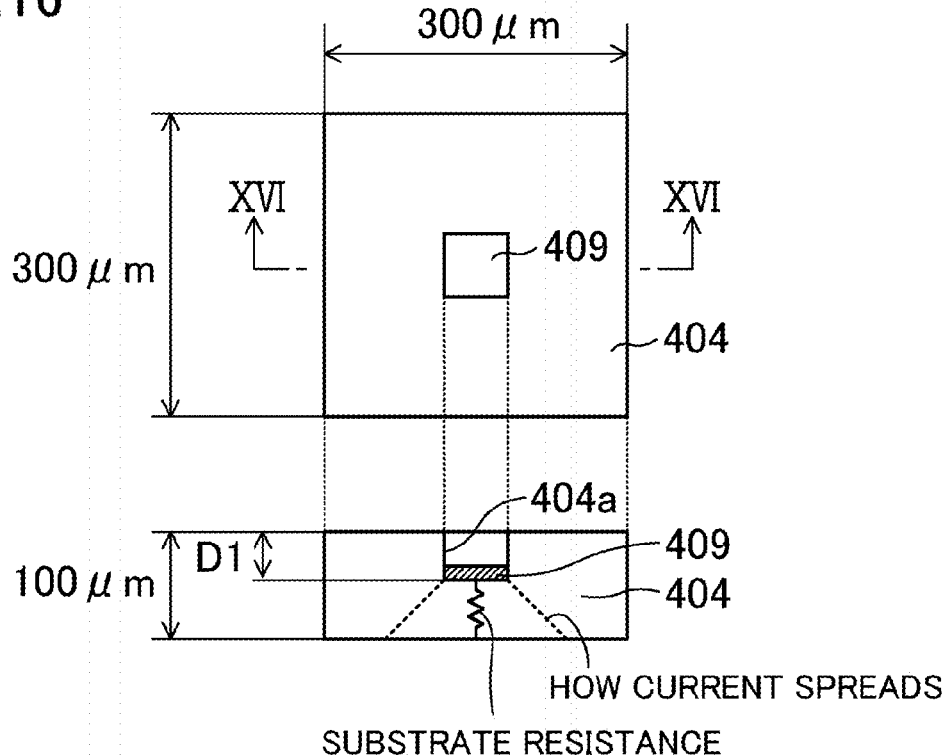
FIG. 16 illustrates schematic plan and cross-sectional views of a reference element for calculating the influence of the depth D1 of a recess on the substrate resistance.

FIG. 16 illustrates a schematic configuration of a reference element for calculating the influence of the depth D1 of a recess 404a formed in an n-type m-plane GaN substrate 404 on the substrate resistance.

The element had sides each having a length of 300 μm, and the thickness of the n-type m-plane GaN substrate 404 was 100 μm. The resistivity of the n-type m-plane GaN substrate 404 was 0.026 Ωcm. An n-side electrode 409 was square when viewed in plan, and the area ratio of the n-side electrode 409 to the element size was varied among 10%, 20%, 30%, 50%, and 70%. The contact resistance between the n-side electrode 409 and the n-type m-plane GaN substrate 404 was $3 \times 10^{-5}$ Ωcm². Calculation was performed using the depth D1 of the recess 404a as a parameter. To perform calculation, it was assumed that current flowing from the n-side electrode 409 spreads in the n-type m-plane GaN substrate 404 at an angle of 45°.

Figure 17:
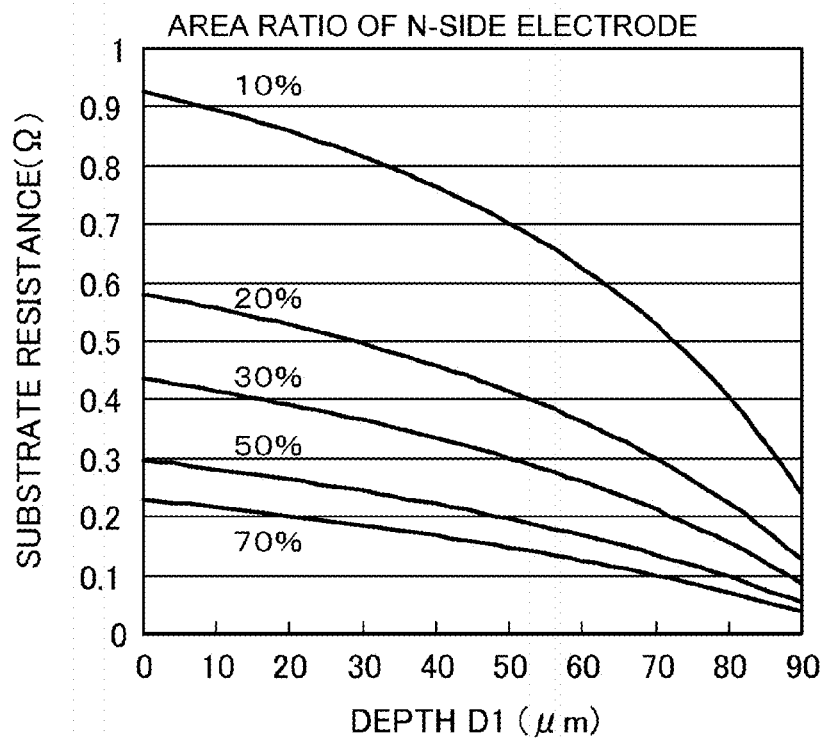
FIG. 17 is a graph illustrating the relationship between the depth D1 of the recess and the substrate resistance together with the area ratio of the n-side electrode.

FIG. 17 illustrates the relationship between the depth D1 (μm) of the recess 404a and the substrate resistance (Ω). As seen from FIG. 17, with increasing area ratio of the n-side electrode 409, the substrate resistance decreases. This means that when the area ratio of the n-side electrode 409 is low, i.e., when a small n-side electrode 409 for the chip size is used, current concentrates on the n-side electrode 409 having a low area ratio, and thus, the current does not spread in the n-type m-plane GaN substrate 404 to an adequate level. Therefore, an increase in area ratio of the n-side electrode 409 helps reduce the substrate resistance. However, when the area ratio of the n-side electrode 409 exceeds 60%, this makes it difficult to reduce the substrate resistance. The reason for this is that the current does not spread to an area greater than or equal to 300 μm square corresponding to the element size.

FIG. 17 shows that a nitride semiconductor laser element using a substrate made of n-type GaN can include an n-side electrode having a sufficiently large area, such as an area ratio greater than or equal to 60%, and thus, the substrate resistance is not considered as a problem. In contrast, in the case of an LED element including an n-side electrode that is desired to have an area ratio (%) of 18% or less, the influence of the substrate resistance is not negligible. Furthermore, it is seen that the substrate resistance can be reduced with increasing depth D1.

(4) Influence of Placement of N-Side Electrodes on Substrate Resistance

Figure 18A:
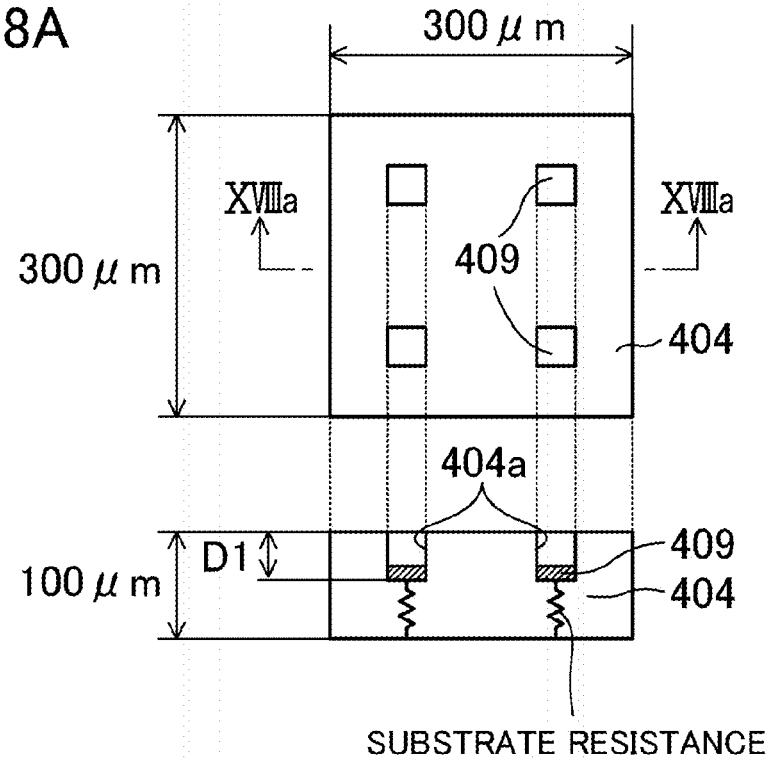
FIGS. 18A and 18B are schematic plan views and cross-sectional views illustrating a reference element for calculating the influence of the placement of n-side electrodes on the substrate resistance.

FIG. 18A illustrates a schematic configuration of a reference element for calculating the influence of the placement of a plurality of n-side electrodes on the substrate resistance. The element had sides each having a length of 300 μm, and the thickness of an n-type m-plane GaN substrate 404 was 100 μm. The resistivity of the n-type m-plane GaN substrate 404 was 0.026 Ωcm. N-side electrodes 409 were square when viewed in plan, and the ratio of the total area of the n-side electrodes 409 to the element size was 10%. The contact resistance between the n-side electrodes 409 and the n-type m-plane GaN substrate 404 was $3\times10^{-5}$ Ωcm$^2$. Calculation was performed using the depth D1 of the recess 404a as a parameter.

Figure 18B:
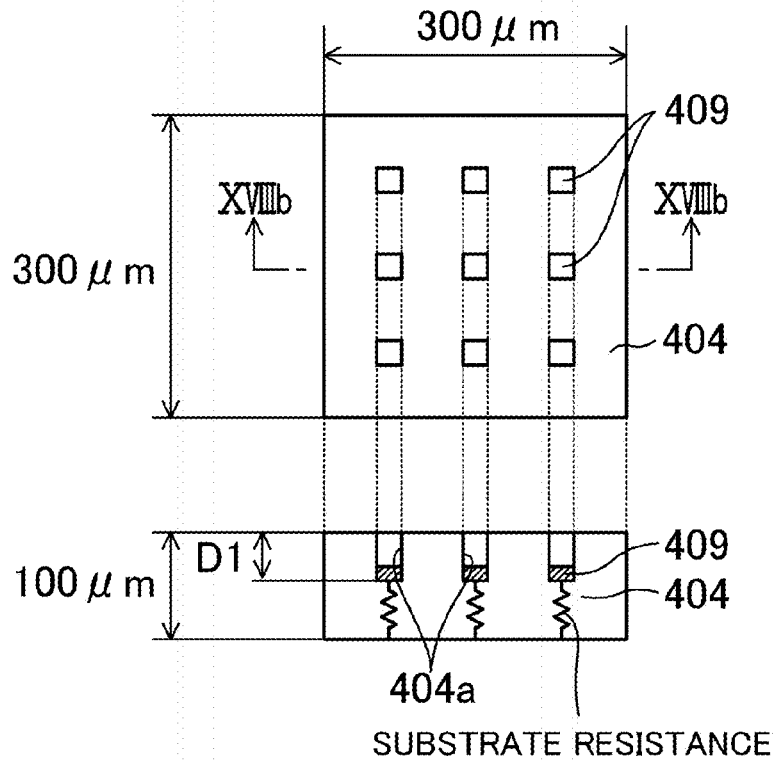

In FIG. 18A, the ratio of the total area of the n-side electrodes 409 is 10%, and in this situation, four n-side electrodes 409 are arranged in a two-by-two matrix when viewed in plan. In FIG. 18B, the ratio of the total area of the n-side electrodes 409 is 10%, and in this situation, nine n-side electrodes 409 are arranged in a three-by-three matrix when viewed in plan.

Figure 19A:
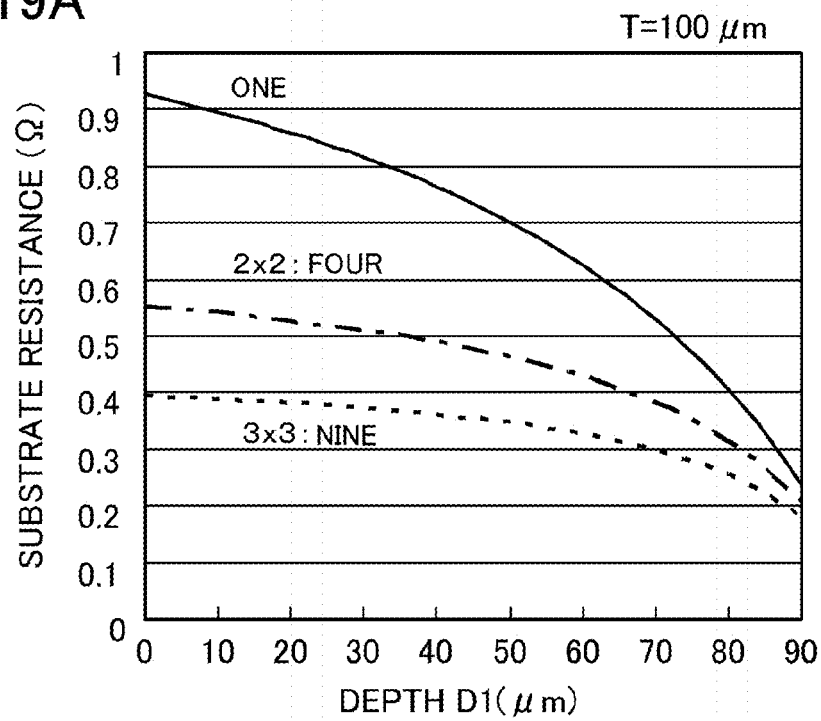
FIGS. 19A and 19B are graphs illustrating the relationship between the depth D1 of a recess or each of recesses and the substrate resistance together with the number of electrodes placed.

FIG. 19A illustrates the relationship between the depth D1 (μm) of a recess 104a or each of recesses 104a and the substrate resistance (Ω), where the number of n-side electrodes placed is varied. Specifically, FIG. 19A illustrates the relationship between the depth D1 (μm) of the recess 104a and the substrate resistance (Ω) when the number of n-side electrodes 409 placed is varied among one, four, and nine. When one n-side electrode 409 is placed, the one n-side electrode 409 is placed on the substrate having an area of 90000 μm$^2$. When the number of n-side electrodes 409 is four, one of the n-side electrodes 409 is placed per an area of 22500 μm$^2$ of the substrate. When the number of n-side electrodes 409 is nine, one of the n-side electrodes 409 is placed per an area of 10000 μm$^2$ of the substrate.

The result illustrated in FIG. 19A shows that even when the ratio of the total area of the n-side electrodes 409 remains at 10% independently of the number of the n-side electrodes 409 placed, the plurality of n-side electrodes 409 are placed in separate regions of the substrate to enable a reduction in current concentration. As a result, the substrate resistance decreases. The placement of a plurality of n-side electrodes significantly decreases the substrate resistance, in particular, when the depth D1 (μm) is small.

However, when the number of n-side electrodes 409 placed increases, interconnects are required to connect the n-side electrodes 409 together. As a result, the light extraction efficiency is decreased.

Specifically, when one of the n-side electrodes 409 is placed per an area of 22500 μm$^2$ of a chip, this can reduce the substrate resistance to about one half of that when a chip includes a single n-side electrode 409. When one of the n-side electrodes 409 is placed per an area of 10000 μm$^2$ of a chip, this can reduce the substrate resistance to about two fifth of that when a chip includes a single n-side electrode 409. In any of these cases, the formation of recesses 404a in the n-type m-plane GaN substrate 404 reduces the substrate resistance, and with increasing depth D1 (μm) of each of the recesses 404a, the substrate resistance decreases.

Figure 19B:
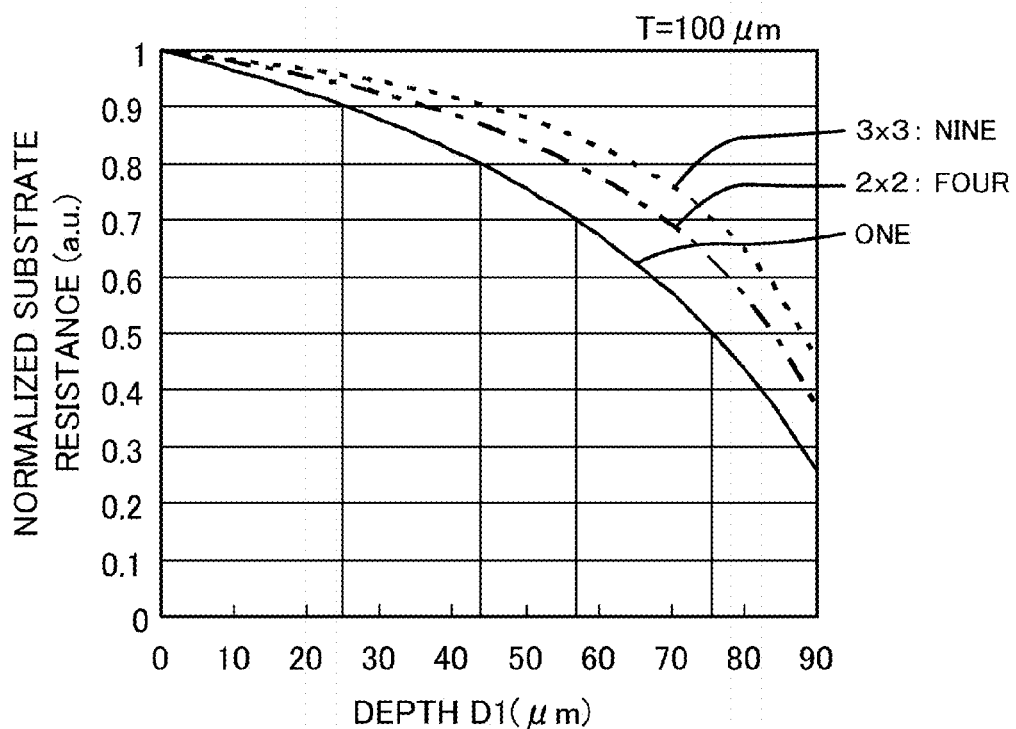

FIG. 19B illustrates the relationship between the depth D1 (μm) of the recess 404a or each of the recesses 404a and the normalized substrate resistance when the number of the n-side electrodes 409 placed is varied among one, four, and nine. The normalized substrate resistance denotes a value normalized based on the substrate resistance at a depth D1 (μm) of 0 μm, i.e., the substrate resistance of an element having a conventional structure, and shows the degree to which the substrate resistance can be reduced depending on the depth D1 (μm).

When the depth D1 of the recess 404a or each of the recesses 404a is 25 μm, i.e., 25% or more of the thickness T, the substrate resistance can be about 5-10% lower than when no recess 404a is formed. When the depth D1 is 44 μm, i.e., 44% or more of the thickness T, the substrate resistance can be about 10-20% lower than when no recess 404a is formed. When the depth D1 is 57 μm, i.e., 57% or more of the thickness T, the substrate resistance can be about 17-30% lower than when no recess 404a is formed. When the depth D1 is 76 μm, i.e., 76% or more of the thickness T, the substrate resistance can be about 30-50% lower than when no recess 404a is formed.

(5) Influence of Direction of Extension of Uneven Structure Formed on Light Extraction Surface Upon Polarization Characteristics Light naturally propagates in a direction perpendicular to the direction of polarization of the light. When a striped uneven structure 115 is formed on a light extraction surface of a nitride semiconductor light emitting chip 100 including an active layer 106 emitting polarized light, the angle θ formed between the direction of extension of the uneven structure 115 and the direction of polarization of the light from the active layer 106 is significant. Here, the angle θ formed between the direction of extension of the stripes and the direction of polarization of the light will be described with reference to FIGS. 20A-22.

FIGS. 20A-20E schematically illustrate light extraction when the chip including the active layer 106 emitting light having polarization characteristics includes a striped uneven structure 115. Here, in order to focus attention on light extraction from the conductive substrate 104 including the striped uneven structure 115, no n-side electrode is formed on the back surface of the conductive substrate 104.

FIG. 20A illustrates the configuration of a conductive substrate 104 including a striped uneven structure 115 when viewed in plan. The character θ represents the angle formed between the direction of extension of the striped uneven structure 115 and the direction of polarization of light from an active layer 106.

FIG. 20B illustrates a cross section taken along the line x-x in FIG. 20A when the angle θ is 0°, and FIG. 20C illustrates a cross section taken along the line y-y in FIG. 20A when the angle θ is 0°. FIG. 20D illustrates a cross section taken along the line x-x in FIG. 20A when the angle θ is 90°, and FIG. 20E illustrates a cross section taken along the line y-y in FIG. 20A when the angle θ is 90°. The arrows illustrated in FIGS. 20B-20E schematically illustrate light emitted from a certain emission point.

In the cross-sectional view illustrated in FIG. 20B and taken along the line x-x when the angle θ is 0°, light emitted from the active layer 106 spreads from the emission point to have the shape of a sector. In this case, light enters the top surface of one of raised portions of the uneven structure located over the emission point on which attention has been focused. However, light directed to the top surfaces of the other raised portions except the raised portion located over the emission point is blocked by recessed portions of the uneven structure. Specifically, when the angle θ formed between the direction of extension of the striped uneven structure 115 and the direction of polarization of light is small, the amount of light incident upon the recessed portions increases, and the amount of light incident upon the top surfaces of the raised portions decreases.

In contrast, in the cross-sectional view illustrated in FIG. 20D and taken along the line x-x when the angle θ is 90°, light emitted from an active layer 106 enters a striped uneven structure 115 in a direction perpendicular thereto. In this case, the amount of light incident upon recessed portions of the uneven structure depends on the ratio of the width of the top surface of each of raised portions of the uneven structure to the width of the bottom surface of each of the recessed portions.

Here, in order to simplify the configuration of the striped uneven structure 115, and convert the influence of the angle θ into numbers, the recessed portions formed in stripes each form a square shape having a depth L1 and a width L1, L2 represents the width of the top surface of each of the raised portions, and T represents the distance from the top surfaces of the raised portions to the active layer 106. Here, the striped uneven structure 115 can be expressed using three parameters, i.e., θ, A, and B, where A represents the ratio of L1 to T (A=L1/T), and B represents the ratio of L2 to L1 (B=L2/L1). A situation where the value A is small corresponds to a situation where the recessed portions each having a small size relative to the size of the nitride semiconductor light emitting chip 100 are formed. The value A is less than one. A situation where the value B is small corresponds to a situation where the area of the top surface of each of the raised portions is small. A situation where the value B is zero corresponds to a situation where the raised portions do not have a top surface. A situation where the value B is small corresponds also to a situation where the recessed portions are formed at high density.

Figure 21:
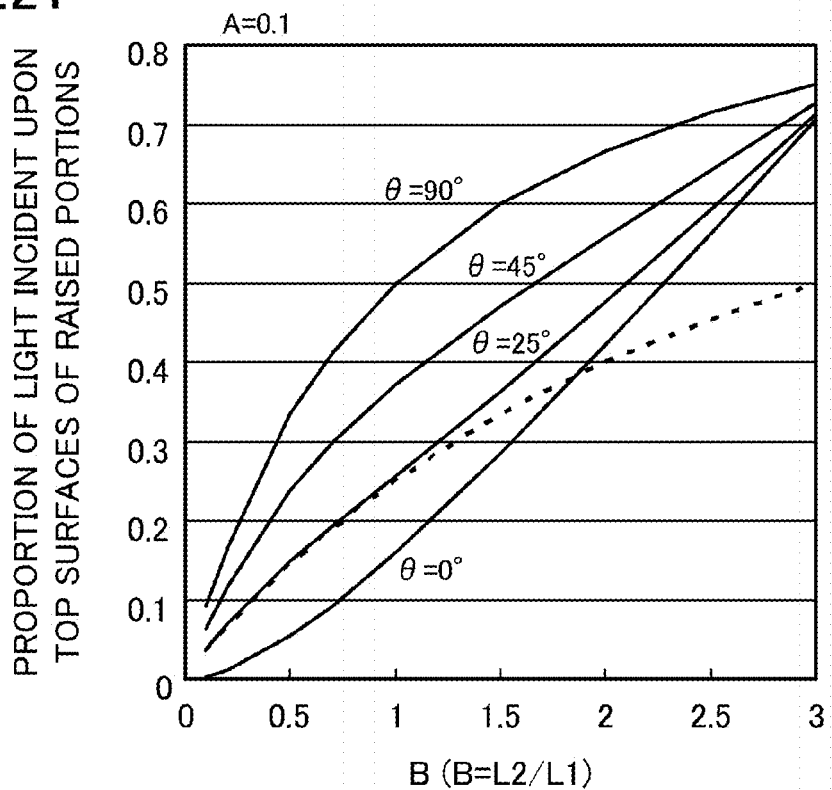
FIG. 21 is a graph illustrating the relationship between the ratio of the width of each of raised portions of the striped uneven structure and the proportion of light incident on the top surfaces of the raised portions.

FIG. 21 illustrates the result of calculating the relationship between the value B and the proportion of light incident upon the top surfaces of the raised portions, where the value A is fixed at 0.1, and the angle θ is varied among 0°, 25°, 45°, and 90°. The broken line in this figure illustrates the ratio of the total area of the top surfaces of the raised portions to the total area of the surfaces (bottom and inner surfaces) of the recessed portions. In other words, the broken line illustrates the calculation result when the active layer does not emit polarized light. Here, the proportion of light incident upon the top surfaces of the raised portions, which is represented by the ordinate, is normalized using one as a maximum value. A value obtained by subtracting the proportion from one denotes the proportion of light incident upon the surfaces of the recessed portions.

The result illustrated in FIG. 21 shows that when the active layer 106 emits polarized light, the angle θ may be in the range from 25° to 90° in order to increase the influence of the top surfaces of the raised portions (reduce the influence of the interiors of the recessed portions). In contrast, when the active layer 106 emits polarized light, the angle θ may be in the range from 0° to 25° in order to reduce the influence of the top surfaces of the raised portions (increase the influence of the interiors of the recessed portions). As such, when light emitted from the active layer 106 has polarization characteristics, the influence of the surfaces of the recessed portions cannot be estimated simply from the surface area, and the angle θ needs to be considered.

Figure 22:
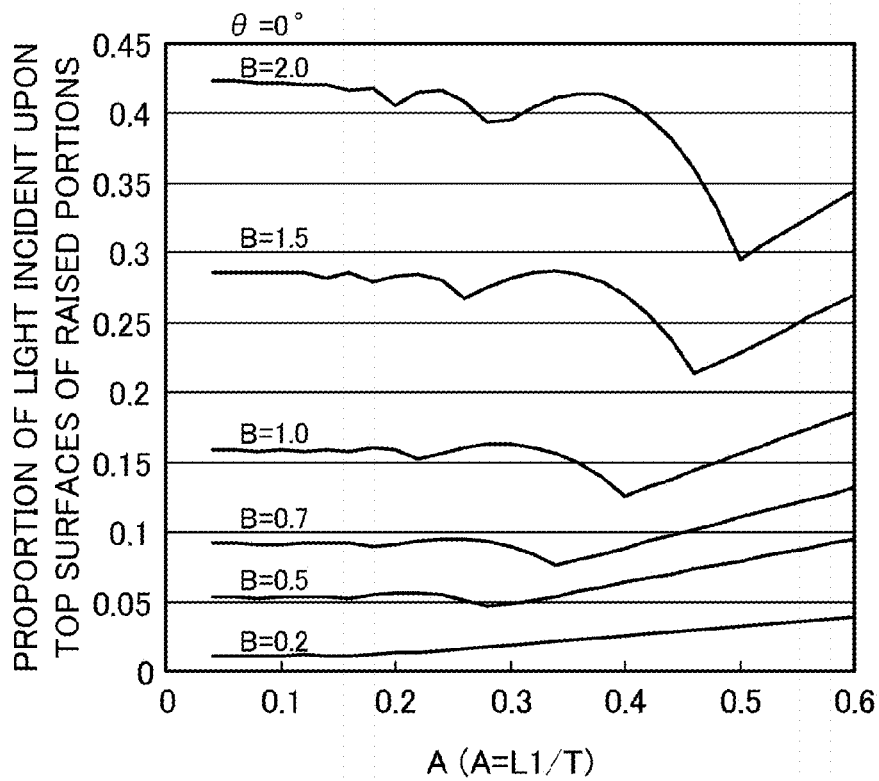
FIG. 22 is a graph illustrating the relationship between the ratio of the width of each of recessed portions of the striped uneven structure to the distance from the top surface of the striped uneven structure to an active layer, and the proportion of the light incident on the top surfaces of the raised portions.

FIG. 22 illustrates the result of calculating the relationship between the value A and the proportion of light incident upon the top surfaces of the raised portions, where the angle θ is fixed at 0°, and the value B is varied among 0.2, 0.5, 0.7, 1.0, 1.5, and 2.0. The value A represents a parameter indicating the size of each of the recessed portions. When the value A is equal to 0.1, this means that the recessed portions each have a size corresponding to 10% of the thickness of the substrate, and when the value A is equal to 0.5, this means that the recessed portions each have a size corresponding to 50% of the thickness of the substrate. The proportion of light incident upon the top surfaces of the raised portions weakly depends on the value A, and is relatively stabilized until the value A reaches about 0.4. When the value B is greater than 1.0, the proportion is a local minimum value within the value A range from 0.4 to 0.5.

The above results show that in order to reduce the substrate resistance by forming n-side electrodes in groove-like recessed portions formed in the back surface of the conductive substrate 104, the influence of the recessed portions needs to be reduced, and conversely, the influence of the top surfaces of the raised portions needs to be increased to reduce the phenomenon where light is blocked by the n-side electrodes. Specifically, when θ1 represents the angle formed between the direction of extension of the striped uneven structure 115 and the direction of polarization of light from the active layer 106, the angle θ1 may be within the range from 25° to 90°. The angle θ1 may be within the range from 45° to 90°. The angle θ1 may be substantially 90°.

In order to improve the light extraction efficiency by forming a striped uneven structure 115 on the back surface of the conductive substrate 104, the light output is increased by increasing the area of the back surface of the conductive substrate 104. Therefore, the influence of the inner surfaces of the recessed portions needs to be increased. Specifically, when θ2 represents the angle formed between the direction of extension of the striped uneven structure 115 and the direction of polarization of light from the active layer, the angle θ2 may be within the range from 0° to 45°. The angle θ2 may be within the range from 0° to 25°. The angle θ2 may be substantially 0°.

(6) Influence of Thermal Melting Using High-Density Laser Light on Shape of Recess Surface A technique of forming a recess in an n-type GaN substrate by thermal melting using high-density pulsed laser light was studied. To study this technique, an m-plane GaN substrate having a thickness of 100 μm was prepared, and a high-density pulsed laser apparatus made by DISCO Corporation was used.

Figure 23:
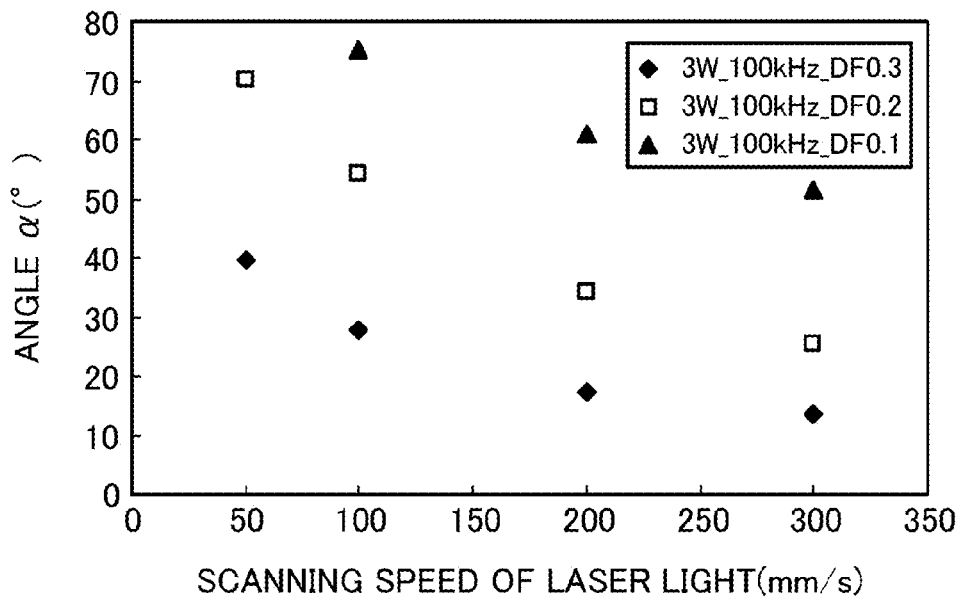
FIG. 23 is a graph illustrating the relationship between the scanning speed of high-density pulsed laser light and the angle α between the wall surface of a recess and the direction of the normal line to the substrate (the direction along an m-axis).

FIG. 23 illustrates the relationship between the scanning speed of high-density pulsed laser light and the angle α formed between the wall surface of the recess and the direction of the normal line to the substrate (m-axis direction). The distance between the location of the focus of laser light and the substrate surface is referred to as the defocus distance (DF distance). That is, when the DF distance is 0.1 mm, this means that the location of the focus of the laser light is 0.1 mm apart from the substrate surface. To study this technique, a case where the DF distance is 0.1 mm, a case where the DF distance is 0.2 mm, and a case where the DF distance is 0.3 mm were examined.

As seen from FIG. 23, the angle α can be reduced by increasing the DF distance.

Figure 24:
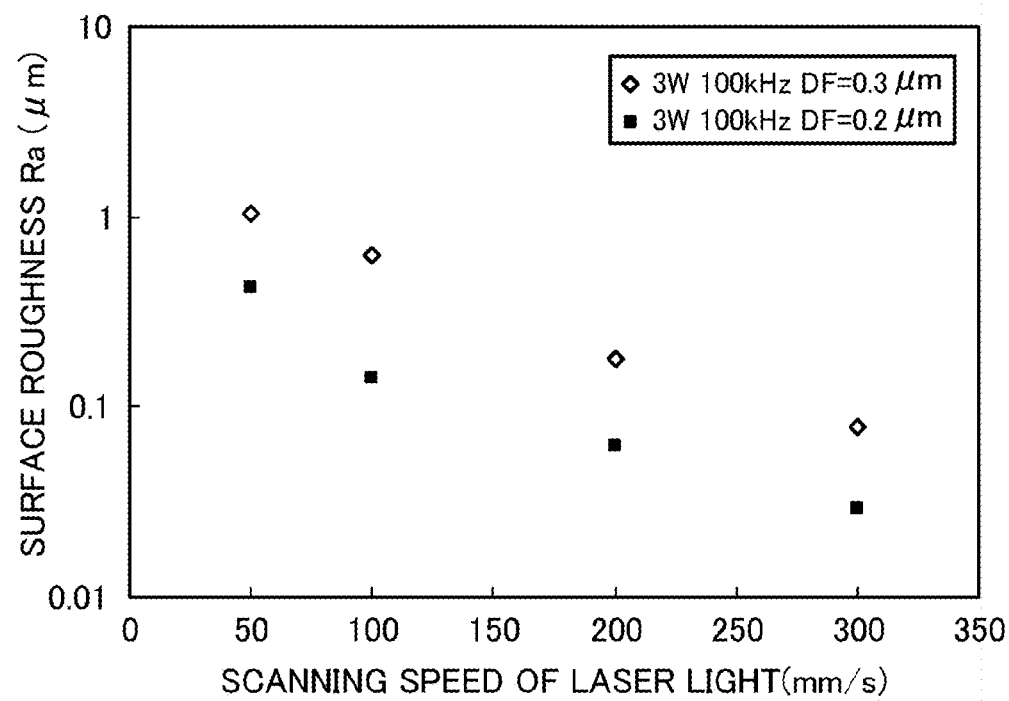
FIG. 24 is a graph illustrating the relationship between the scanning speed of the laser light and the surface roughness Ra of the inner surface of the recess.

FIG. 24 illustrates the relationship between the scanning speed of laser light and the surface roughness Ra of the inner surface of the recess. The surface roughness Ra can be increased by reducing the scanning speed of the laser light. FIG. 24 shows that the surface roughness Ra can be controlled within the range from 20 nm to 1 μm by controlling the DF distance and the scanning speed of the laser light.

First Example

Figure 25:
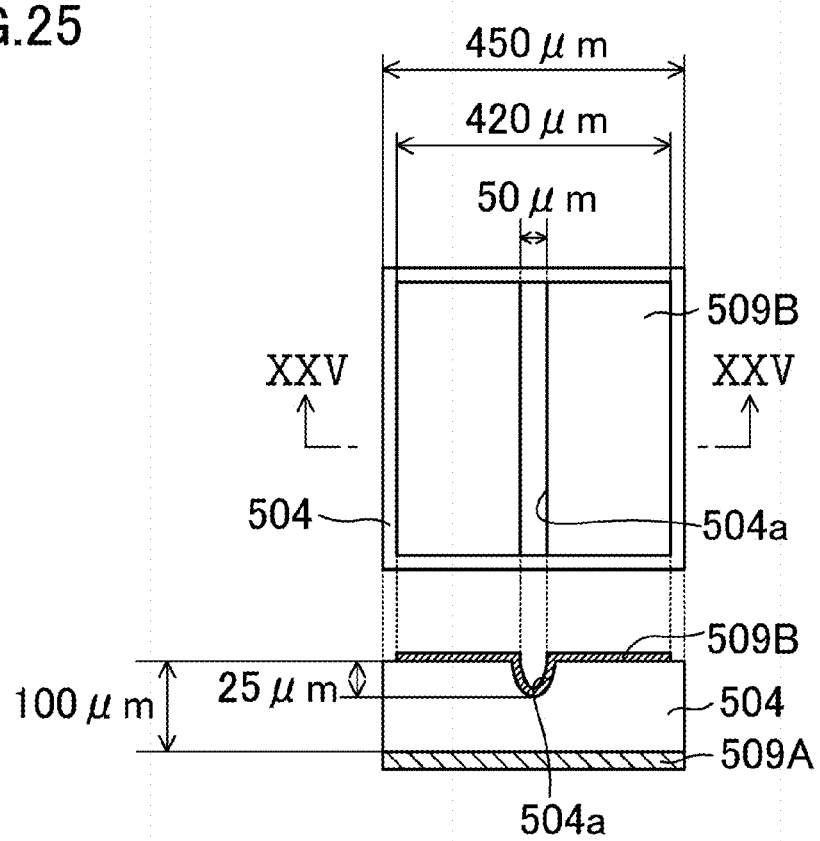
FIG. 25 illustrates a plan view and a cross-sectional view of a schematic configuration of a substrate resistance reference element according to a first example.

FIG. 25 illustrates a schematic configuration of a substrate resistance reference element according to a first example. Here, in order to more accurately extract the effect of reducing the substrate resistance, a reference element including an n-side electrode 509A formed on the entire back surface of a substrate 504, and an n-side electrode layer 509B formed on the front surface of the substrate 504 was used. In other words, the substrate resistance reference element according to the first example does not include an n-type nitride semiconductor layer, an active layer, a p-type nitride semiconductor layer, and a p-side electrode.

First, a 100-μm-thick n-type m-plane GaN substrate at the wafer level was prepared as the substrate 504.

Next, a stripe-shaped (groove-like) recess 504a having a width of 50 μm and a depth of 25 μm was formed in one of the surfaces of the n-type m-plane GaN substrate 504 by using a high-density pulsed laser apparatus made by DISCO Corporation. Thereafter, residues were removed by hydrochloric acid. The depth of the recess 504a corresponds to 25% of the thickness of the substrate 504. The recess 504a forms a stripe extending along the c-axis when viewed in plan, and is generally semicircular when viewed in cross section.

In this example, a reference element including one recess 504a, a reference element including two recesses 504a, and a reference element including three recesses 504a were fabricated. For comparison, an element that does not include a recess 504a (the number of recesses: zero), i.e., an element having a conventional structure, was also fabricated.

Next, an n-side electrode layer 509B having sides each having a length of 420 μm, and made of a Ti/Al layer was formed on the surface of the n-type m-plane GaN substrate 504 in which the recess 504a was formed. Subsequently, an n-side electrode 509A made of a Ti/Al layer was formed on the entire back surface of the n-type m-plane GaN substrate 504 in which the recess 504a is not formed. The thickness of the Ti layer in each of the n-side electrode 509A and the n-side electrode layer 509B is 50 nm, and the thickness of the Al layer therein is 750 nm. Here, the order in which the n-side electrode 509A and the n-side electrode layer 509B are formed is not specifically limited.

Next, the n-type m-plane GaN substrate 504 at the wafer level has a front surface on which the n-side electrode layer 509B was formed, and a back surface on which the n-side electrode 509A was formed, and was singulated into pieces having sides each having a length of 450 nm. Thereafter, the resistance of a substrate resistance reference element obtained by singulating the wafer-level substrate was measured.

The ratio of the contact area between a portion of the n-side electrode layer 509B being in contact with the inner surface of the recess 504a and the n-type m-plane GaN substrate 504 (the area ratio of the n-side electrode in the recess) is 17% when the n-type m-plane GaN substrate 504 includes the single recess 504a. When the n-type m-plane GaN substrate 504 includes two recesses 504a, the ratio of the contact area is 35%. When the n-type m-plane GaN substrate 504 includes three recesses 504a, the ratio of the contact area is 52%.

Figure 26:
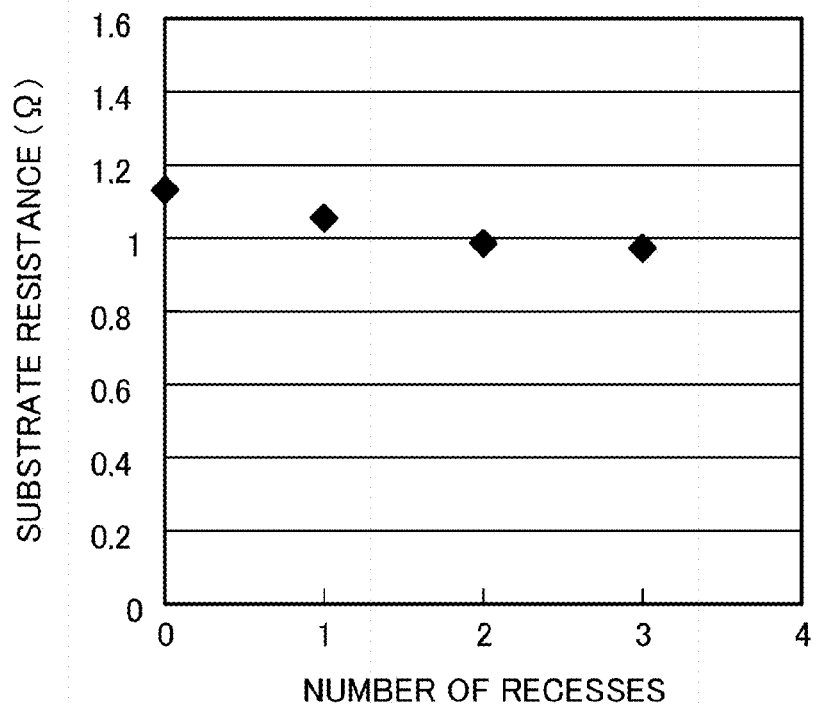
FIG. 26 is a graph illustrating the relationship between the number of recesses and substrate resistance of the substrate resistance reference element according to the first example.

FIG. 26 illustrates the relationship between the number of recesses (grooves) in this example and the substrate resistance. Here, the contact resistance between each of the n-side electrodes (509A, 509B) and the n-type m-plane GaN substrate 504 is $3\times10^{-5}$ Ωcm², and the contact resistance has been subtracted from each of measurement results.

As seen from FIG. 26, when the area ratio of the n-side electrode in the recess is either 17%, 35%, or 52%, the substrate resistance is lower than that of the comparative example.

As described above, it has been recognized that when a recess 504a having a depth corresponding to 25% of the thickness of the n-type m-plane GaN substrate 504 is formed in the n-type m-plane GaN substrate 504, and an electrode is formed in the recess 504a, this can reduce the substrate resistance.

Second Example

Figure 27:
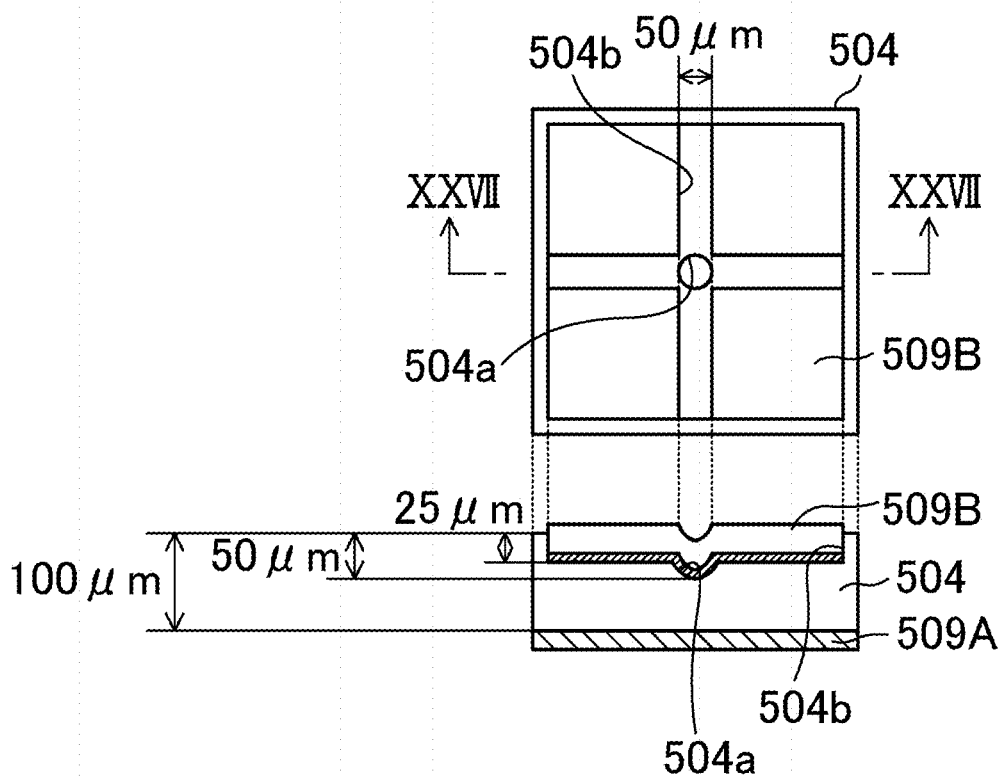
FIG. 27 illustrates a plan view and a cross-sectional view of a schematic configuration of a substrate resistance reference element according to a second example.

FIG. 27 illustrates a schematic configuration of a substrate resistance reference element according to a second example. Similarly to the first example, also here, in order to more accurately extract the effect of reducing the substrate resistance, a reference element including an n-side electrode 509A formed on the entire back surface of a substrate 504, and an n-side electrode layer 509B formed on the front surface of the substrate 504 was used. Therefore, the substrate resistance reference element according to the second example does not include an n-type nitride semiconductor layer, an active layer, a p-type nitride semiconductor layer, and a p-side electrode.

First, a 100-μm-thick n-type m-plane GaN substrate at the wafer level was prepared as the substrate 504.

Next, two stripe-shaped grooves 504b each having a width of 50 μm and a depth of 25 μm and crossing each other were formed in one of the surfaces of the n-type m-plane GaN substrate 504 by using a high-density pulsed laser apparatus made by DISCO Corporation. Thereafter, residues were removed by hydrochloric acid. The two stripe-shaped grooves 504b were formed as two lines extending along the c- and a-axes and crossing each other when viewed in plan. The grooves 504b are each generally semicircular when viewed in cross section. A recess 504a having a depth of about 50 μm was formed in a region of the surface of the n-type m-plane GaN substrate 504 corresponding to a point of intersection of the two grooves 504b.

Substrate resistance reference elements were fabricated such that a recess 504a or recesses 504a and grooves 504b were arranged in the following manner:

(1) one of the substrate resistance reference elements includes one groove extending along the c-axis, and one groove extending along the a-axis (the number of a point of intersection of the grooves: 1);

(2) another one of the substrate resistance reference elements includes one groove extending along the c-axis, and three grooves extending along the a-axis (the number of points of intersection of the grooves: 3);

(3) still another one of the substrate resistance reference elements includes two grooves extending along the c-axis, and three grooves extending along the a-axis (the number of points of intersection of the grooves: 6); and (4) the other one of the substrate resistance reference elements includes three grooves extending along the c-axis, and three grooves extending along the a-axis (the number of points of intersection of the grooves: 9).

For comparison, a conventional structure that does not include a recess 504a and a groove 504b (the number of points of intersection of grooves: zero) was also fabricated.

Figure 28A:
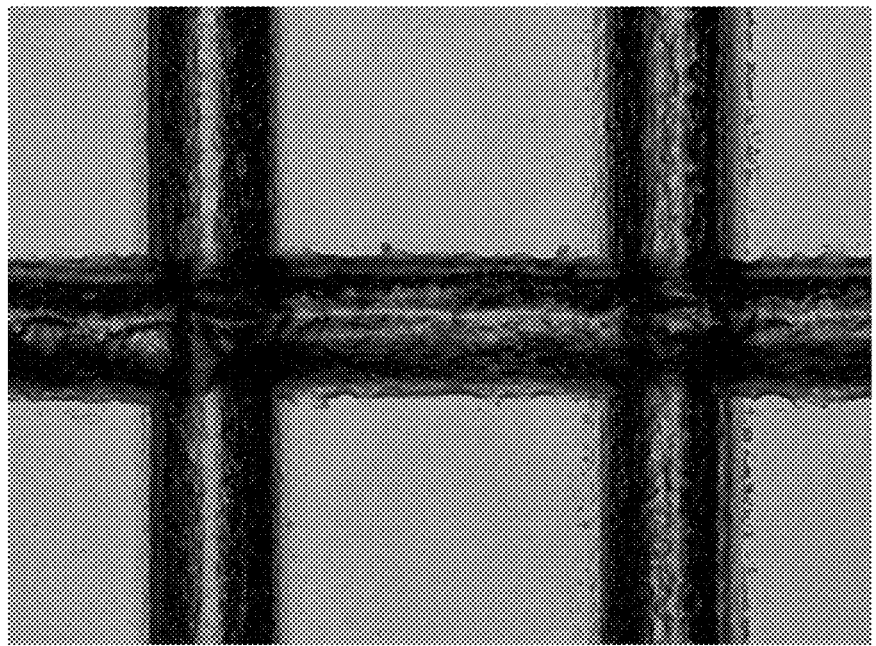
FIG. 28A is a photomicrograph of recesses formed with high-density pulsed laser light.

FIG. 28A is a photomicrograph of recesses 504a and grooves 504b formed with high-density pulsed laser light. Points of intersection of the grooves 504b have been enlarged.

Figure 28B:
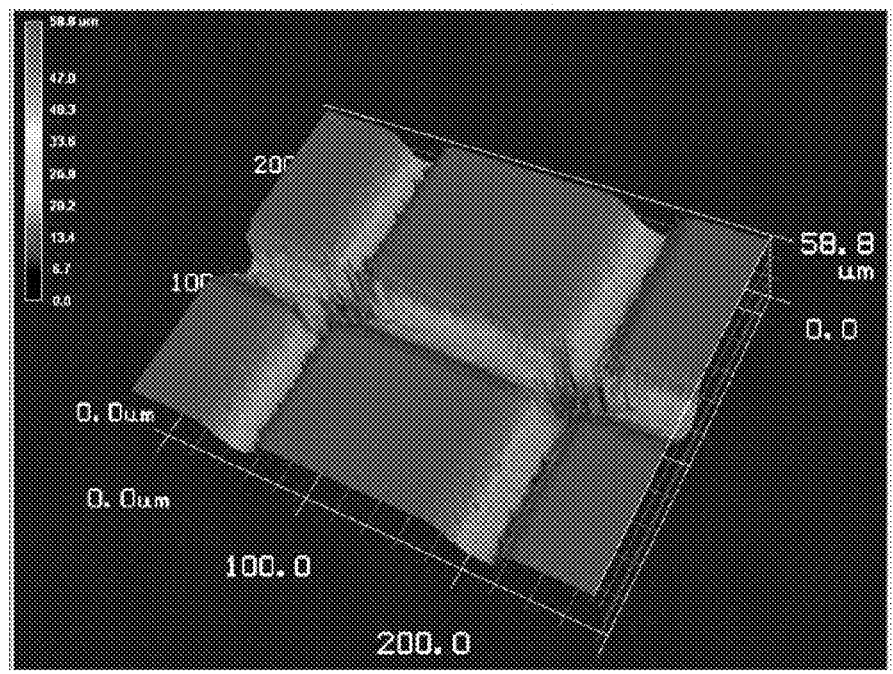
FIG. 28B is a measurement diagram illustrating the shape of each of the recesses measured using a laser level difference measuring device.

FIG. 28B is a measurement diagram illustrating the shapes of the recesses 504a and the grooves 504b measured using a laser level difference measuring device. The measurement results of the laser level difference measuring device show that the depth of each of the grooves 504b was 23.6 µm, and the depth of each of the recesses (points of intersection of the grooves) 504a was 45.8 µm. The depth of the recess 504a is about twice the depth of the groove 504b. The depth of the recess 504a corresponds to about 46% of the thickness of the substrate 504.

As such, high-density pulsed laser light is operated such that points of intersection of grooves are formed. Thus, recesses 504a and grooves 504b having a depth different from the depth of each of the recesses 504a are formed in one process step. The surface roughness Ra of the inner surfaces of the recesses 504a and the grooves 504b was measured, and the measured surface roughness Ra was 0.68 nm.

Next, an n-side electrode layer 509B having sides each having a length of 420 nm, and made of a Ti/Al layer was formed on a surface of the n-type m-plane GaN substrate 504 in which the recess 504a was formed. Subsequently, an n-side electrode 509A made of a Ti/Al layer was formed on the entire back surface of the n-type m-plane GaN substrate 504 in which the recess 504a was not formed. The thickness of the Ti layer in each of the n-side electrode 509A and the n-side electrode layer 509B is 50 nm, and the thickness of the Al layer therein is 750 nm. Here, the order in which the n-side electrode 509A and the n-side electrode layer 509B are formed is not specifically limited.

Next, the n-type m-plane GaN substrate 504 at the wafer level has a front surface on which the n-side electrode layer 509B was formed, and a back surface on which the n-side electrode 509A was formed, and was singulated into pieces having sides each having a length of 450 nm. Thereafter, the resistance of a substrate resistance reference element obtained by singulating the wafer-level substrate was measured.

Figure 29:
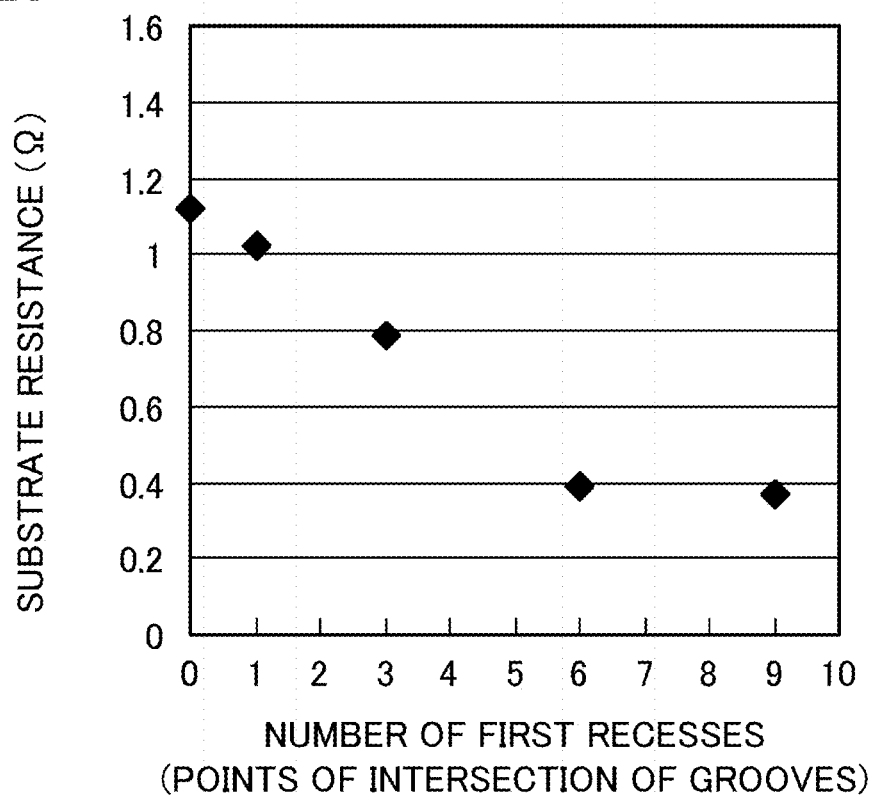
FIG. 29 is a graph illustrating the relationship between the number of first recesses (points of intersection of grooves) and substrate resistance of the substrate resistance reference element according to the second example.

FIG. 29 illustrates the substrate resistance according to this example. Here, the contact resistance between each of the n-side electrodes (509A, 509B) and the n-type m-plane GaN substrate 504 is $3 \times 10^{-5}$ Ωcm², and the contact resistance has been subtracted from measurement results.

As seen from FIG. 29, with increasing number of points of intersection of shallow stripe-shaped grooves 504b, i.e., with increasing number of recesses 504a deeper than the grooves 504b, the substrate resistance decreases. When the number of points of intersection of the grooves 504b is six or more, the substrate resistance does not greatly change.

It was recognized that when, as such, the recesses 504a each having a depth corresponding to 46% of the substrate thickness is formed, and an electrode is formed in each of the recesses 504a, this can reduce the substrate resistance.

The above-described first through third embodiments and examples can be used in combination if necessary.

As described above, a nitride semiconductor light emitting chip according to the present disclosure and a nitride semiconductor light emitting device using the same can reduce the direct current resistance of a combination of an n-type nitride semiconductor layer and an n-type conductive substrate, and thus, can reduce the operating voltage, thereby improving the luminous efficiency, such as the power utilization efficiency.

The present disclosure can be utilized for, e.g., general lighting.

What is claimed is:

1. A nitride semiconductor light emitting chip comprising:
   a conductive substrate having a principal surface that is a nonpolar or semipolar plane;
   an n-type nitride semiconductor layer formed on the principal surface;
   an active layer formed on the n-type nitride semiconductor layer to emit polarized light;
   a p-type nitride semiconductor layer formed on the active layer; and
   an n-side electrode formed in contact with the conductive substrate, wherein
   the conductive substrate has a recess formed in a back surface of the conductive substrate opposite to the principal surface,
   the n-side electrode is in contact with at least part of a surface of the recess,
   a depth D1 is not less than 25% of a thickness T, where T represents a thickness of the conductive substrate, and D1 represents a depth of the recess,
   the recess is a groove extending in one direction,
   an angle θ1 is not less than 25° and not more than 90°, where θ1 represents an angle formed between the one direction of the extension of the groove and a direction of polarization of light from the active layer, and
   a region of the back surface in which the recess is not formed is flat.

2. The nitride semiconductor light emitting chip of claim 1, wherein
   the depth D1 is not less than 44% of the thickness T.

3. The nitride semiconductor light emitting chip of claim 1, wherein
   the depth D1 is not less than 57% of the thickness T.

4. The nitride semiconductor light emitting chip of claim 1, wherein
   the depth D1 is not less than 76% of the thickness T.

5. The nitride semiconductor light emitting chip of claim 1, wherein
   the thickness T is not less than 80 µm and not more than 200 µm.

6. The nitride semiconductor light emitting chip of claim 1, wherein
   the thickness T is not less than 100 µm and not more than 150 µm.

7. The nitride semiconductor light emitting chip of claim 1, wherein
   the recess is placed per an area of 22500 µm² of the nitride semiconductor light emitting chip when viewed in plan.

8. The nitride semiconductor light emitting chip of claim 1, wherein
   the recess is placed per an area of 10000 µm² of the nitride semiconductor light emitting chip when viewed in plan.

9. The nitride semiconductor light emitting chip of claim 1, wherein
   a contact area between the surface of the recess and the n-side electrode is not less than 5% of an area of the nitride semiconductor light emitting chip when viewed in plan and not more than 18% of the area.

10. The nitride semiconductor light emitting chip of claim 1, wherein
    minute projections/recesses are formed in the surface of the recess.

11. The nitride semiconductor light emitting chip of claim 1, wherein
the angle $\theta 1$ is not less than 45° and not more than 90°.

12. The nitride semiconductor light emitting chip of claim 11, wherein
the angle $\theta 1$ is substantially 90°.

13. A nitride semiconductor light emitting chip comprising:
a conductive substrate having a principal surface that is a nonpolar or semipolar plane;
an n-type nitride semiconductor layer formed on the principal surface;
an active layer formed on the n-type nitride semiconductor layer to emit polarized light;
a p-type nitride semiconductor layer formed on the active layer; and
an n-side electrode formed in contact with the conductive substrate, wherein
the conductive substrate has a recess formed in a back surface of the conductive substrate opposite to the principal surface,
the n-side electrode is in contact with at least part of a surface of the recess,
a depth D1 is not less than 25% of a thickness T, where T represents a thickness of the conductive substrate, and D1 represents a depth of the recess,
the conductive substrate has an uneven structure formed on a region of the back surface in which the recess is not formed,
a peak-to-valley distance of the uneven structure is smaller than the depth of the recess,
the uneven structure has a striped pattern,
an angle $\theta 2$ is not less than 0° and not more than 45°, where $\theta 2$ represents an angle formed between a direction of extension of the striped pattern and a direction of polarization of light from the active layer,
the recess is a groove extending in one direction, and
an angle $\theta 1$ is not less than 25° and not more than 90°, where $\theta 1$ represents an angle formed between the one direction of the extension of the groove and the direction of polarization of light from the active layer.

14. The nitride semiconductor light emitting chip of claim 13, wherein
the angle $\theta 2$ is not less than 0° and not more than 25°.

15. The nitride semiconductor light emitting chip of claim 14, wherein the angle $\theta 2$ is substantially 0°.

16. A nitride semiconductor light emitting chip comprising:
a conductive substrate having a principal surface that is a nonpolar or semipolar plane;
an n-type nitride semiconductor layer formed on the principal surface;
an active layer formed on the n-type nitride semiconductor layer to emit polarized light;
a p-type nitride semiconductor layer formed on the active layer; and
an n-side electrode formed in contact with the conductive substrate, wherein
the conductive substrate has a recess formed in a back surface of the conductive substrate opposite to the principal surface, and a first groove and a second groove formed in the back surface to cross each other,
the first and second grooves are connected to the recess at a point of intersection of the first and second grooves,
the n-side electrode is in contact with at least part of a surface of the recess,
a depth D1 is not less than 25% of a thickness T, where T represents a thickness of the conductive substrate, and D1 represents a depth of the recess, and
the depth of the recess is greater than a depth of each of the first and second grooves.

17. The nitride semiconductor light emitting chip of claim 16, wherein
the depth D1 of the recess is substantially twice a depth D2 of each of the first and second grooves.

18. A nitride semiconductor light emitting device comprising:
a mounting substrate holding the nitride semiconductor light emitting chip of claim 1 or the nitride semiconductor light emitting chip of claim 1 including a plurality of nitride semiconductor light emitting chips;
an electrode layer formed on the mounting substrate;
a connection member electrically connecting the nitride semiconductor light emitting chip with the electrode layer; and
a light-transmissive member covering the nitride semiconductor light emitting chip, wherein
the back surface of the conductive substrate serves as a light extraction surface.

19. The nitride semiconductor light emitting device of claim 18, wherein
the n-side electrode is further in contact with at least part of a principal surface of a portion of the conductive substrate except a portion of the conductive substrate in which the recess is formed, and
the connection member is a wire connected to the n-side electrode on the principal surface of the portion of the conductive substrate except the portion of the conductive substrate in which the recess is formed.

20. The nitride semiconductor light emitting device of claim 18, wherein
the light-transmissive member contains a phosphor converting a wavelength of light emitted from the active layer.

* * * * *